(12) United States Patent
Newman et al.

(10) Patent No.: US 10,916,516 B2
(45) Date of Patent: Feb. 9, 2021

(54) HIGH BANDWIDTH MEMORY (HBM) BANDWIDTH AGGREGATION SWITCH

(71) Applicant: Xilinx, Inc., San Jose, CA (US)

(72) Inventors: Martin Newman, Saratoga, CA (US); Sagheer Ahmad, Cupertino, CA (US)

(73) Assignee: XILINX, INC., San Jose, CA (US)

(*) Notice: Subject to any disclaimer, the term of this patent is extended or adjusted under 35 U.S.C. 154(b) by 47 days.

(21) Appl. No.: 15/616,004

(22) Filed: Jun. 7, 2017

(65) Prior Publication Data
US 2018/0358313 A1 Dec. 13, 2018

(51) Int. Cl.
*H01L 23/00* (2006.01)
*G06F 3/06* (2006.01)
(Continued)

(52) U.S. Cl.
CPC ............ *H01L 24/04* (2013.01); *G06F 3/0631* (2013.01); *G06F 12/0802* (2013.01); *G06F 13/1689* (2013.01); *G06F 13/20* (2013.01); *G06F 13/4095* (2013.01); *G06F 13/4234* (2013.01); *G11C 5/06* (2013.01); *G11C 5/063* (2013.01); *G11C 8/18* (2013.01); *H01L 23/5381* (2013.01); *H01L 24/07* (2013.01); *H01L 24/14* (2013.01); *H01L 24/15* (2013.01); *H04L 49/103* (2013.01); *H04L 49/15* (2013.01); *H01L 2224/05005* (2013.01); *H01L 2224/05009* (2013.01); *H01L 2224/0557* (2013.01); *H01L 2224/05075* (2013.01); *H01L 2224/05099* (2013.01); *H01L 2224/1601* (2013.01); *H01L 2224/16227* (2013.01); *H01L 2924/10155* (2013.01);
(Continued)

(58) Field of Classification Search
CPC .... H01L 24/04; G06F 3/0631; G06F 12/0802; G06F 13/1689; G06F 13/20
USPC ......................................... 710/3, 23, 33, 317
See application file for complete search history.

(56) References Cited

U.S. PATENT DOCUMENTS 4,973,956 A * 11/1990 Lin ........................ H04Q 3/521
340/2.2
5,530,813 A * 6/1996 Paulsen ............... G06F 13/4022
710/100
(Continued)

OTHER PUBLICATIONS

U.S. Appl. No. 15/346,512, filed Nov. 8, 2016, Camarota et al.
U.S. Appl. No. 15/237,384, filed Sep. 23, 2016, Camarota.

*Primary Examiner* — Farley Abad
*Assistant Examiner* — Henry W Yu
(74) *Attorney, Agent, or Firm* — Patterson + Sheridan, LLP

(57) ABSTRACT

Methods and apparatus are described for adding one or more features (e.g., high bandwidth memory (HBM)) to a qualified stacked silicon interconnect (SSI) technology programmable integrated circuit (IC) region by providing an interface (e.g., an HBM buffer region implemented with a hierarchical switch network) between the added feature device and the programmable IC region. One example apparatus generally includes a programmable IC region and an interface region configured to couple the programmable IC region to at least one fixed feature die via a first plurality of ports associated with the at least one fixed feature die and a second plurality of ports associated with the programmable IC region. The interface region is configured as a switch network between the first plurality of ports and the second plurality of ports, and the switch network includes a plurality of full crossbar switch networks.

20 Claims, 19 Drawing Sheets

(51) Int. Cl.
  *G06F 12/0802* (2016.01)
  *G06F 13/16* (2006.01)
  *G06F 13/20* (2006.01)
  *H04L 12/933* (2013.01)
  *G11C 5/06* (2006.01)
  *G11C 8/18* (2006.01)
  *G06F 13/42* (2006.01)
  *G06F 13/40* (2006.01)
  *H01L 23/538* (2006.01)

(52) U.S. Cl.
  CPC ............ *H01L 2924/15192* (2013.01); *H01L 2924/15311* (2013.01)

(56) References Cited

U.S. PATENT DOCUMENTS

| | | | | |
|---|---|---|---|---|
| 6,265,895 B1 * | 7/2001 | Schleicher | ....... | H03K 19/17736 326/38 |
| 6,378,029 B1 * | 4/2002 | Venkitakrishnan | .......... | G06F 13/4243 710/317 |
| 7,117,275 B1 * | 10/2006 | Ofek | ..................... | G06F 3/0613 710/33 |
| 7,149,996 B1 * | 12/2006 | Lysaght | ............. | H04Q 3/54533 326/38 |
| 7,689,757 B2 * | 3/2010 | Yancey | ............... | G06F 13/4256 710/312 |
| 8,071,429 B1 * | 12/2011 | Qian | ....................... | H01L 21/78 257/E21.238 |
| 8,704,384 B2 * | 4/2014 | Wu | ....................... | H01L 23/147 257/48 |
| 2002/0075883 A1 * | 6/2002 | Dell | .................... | H04L 49/1576 370/413 |
| 2003/0102526 A1 * | 6/2003 | Dias | .................... | H01L 23/3677 257/618 |
| 2006/0161718 A1 * | 7/2006 | Berke | ................ | G06F 13/4022 710/317 |
| 2007/0063733 A1 * | 3/2007 | Shumarayev | .... | H03K 19/17704 326/41 |
| 2010/0211720 A1 * | 8/2010 | Satpathy | .................. | G11C 7/10 710/317 |
| 2012/0269510 A1 * | 10/2012 | Hui | .................... | H04Q 11/0005 398/50 |
| 2013/0099250 A1 * | 4/2013 | Hua | .................... | H01L 29/0657 257/77 |
| 2013/0268710 A1 * | 10/2013 | Lowe | .................. | G06F 13/4027 710/306 |

\* cited by examiner

1600

| Input/Ouput | S0 | S1 | S2 | S3 | LS_0 | LS_1 | RS_0 | RS_1 |
|---|---|---|---|---|---|---|---|---|
| M0 | 1 | 1 | 1 | 1 | 1 | 0 | 1 | 0 |
| M1 | 1 | 1 | 1 | 1 | 1 | 0 | 1 | 0 |
| M2 | 1 | 1 | 1 | 1 | 0 | 1 | 0 | 1 |
| M3 | 1 | 1 | 1 | 1 | 0 | 1 | 0 | 1 |
| LM_0 | 1 | 1 | 1 | 1 | 0 | 0 | 1 | 0 |
| LM_1 | 1 | 1 | 1 | 1 | 0 | 0 | 0 | 1 |
| RM_0 | 1 | 1 | 1 | 1 | 1 | 0 | 0 | 0 |
| RM_1 | 1 | 1 | 1 | 1 | 0 | 1 | 0 | 0 |

FIG. 16

HIGH BANDWIDTH MEMORY (HBM) BANDWIDTH AGGREGATION SWITCH

CROSS-REFERENCE TO RELATED APPLICATIONS

The present application is related to U.S. patent application Ser. No. 15/346,512, filed Nov. 8, 2016 and entitled "HIGH BANDWIDTH MEMORY (HBM) BANDWIDTH AGGREGATION SWITCH," and to U.S. patent application Ser. No. 15/237,384, filed Sep. 23, 2016 and entitled "STANDALONE INTERFACE FOR STACKED SILICON INTERCONNECT," which are both incorporated herein by reference in their entireties.

TECHNICAL FIELD

Examples of the present disclosure generally relate to integrated circuits (ICs) and, more particularly, to integrated circuit packaging using stacked silicon interconnect (SSI) technology and to an interface between a programmable IC die and a fixed feature die.

BACKGROUND

Electronic devices (e.g., computers, laptops, tablets, copiers, digital cameras, smart phones, and the like) often employ integrated circuits (ICs, also known as "chips"). These integrated circuits are typically implemented as semiconductor dies packaged in integrated circuit packages. The semiconductor dies may include memory, logic, and/or any of various other suitable circuit types.

Many integrated circuits and other semiconductor devices utilize an arrangement of bumps, such as a ball grid array (BGA), for surface mounting packages to a circuit board (e.g., printed circuit board (PCB). Any of various suitable package pin structures, such as controlled collapse chip connection (C4) bumps or microbumps (as used in stacked silicon interconnect (SSI) applications), may be used to conduct electrical signals between a channel on an integrated circuit (IC) die (or other package device) and the circuit board on which the package is mounted.

SUMMARY

One example of the present disclosure is an integrated circuit (IC) package. The IC package generally includes a package substrate; at least one interposer disposed above the package substrate and comprising a plurality of interconnection lines; a programmable IC die disposed above the interposer; a fixed feature die disposed above the interposer; and an interface die disposed above the interposer and configured to couple the programmable IC die to the fixed feature die using a first set of interconnection lines routed through the interposer between the programmable IC die and the interface die and a second set of interconnection lines routed through the interposer between the interface die and the fixed feature die.

Another example of the present disclosure is a method of fabricating an integrated circuit package. The method generally includes providing a mask for a programmable IC die paired with an interface die, the interface die for coupling the programmable IC die to a fixed feature die; generating, using the mask, a wafer having a plurality of the paired programmable IC and interface dies; dicing the wafer to detach a wafer section comprising one of the plurality of the paired programmable IC and interface dies; and disposing the wafer section above an interposer comprising a plurality of interconnection lines, wherein a first set of the interconnection lines is routed through the interposer for electrically connecting the paired programmable IC and interface dies in the wafer section and wherein a second set of the interconnection lines is routed through the interposer for electrically connecting the interface die and the fixed feature die.

Yet another example of the present disclosure is an integrated circuit package. The package generally includes a package substrate; at least one interposer disposed above the package substrate and comprising a plurality of interconnection lines; at least one field programmable gate array (FPGA) die disposed above the interposer; one or more high bandwidth memory (HBM) dies disposed above the interposer; and an HBM buffer die disposed above the interposer and configured to couple the FPGA die to the one or more HBM dies using a first set of interconnection lines routed through the interposer between the FPGA die and the HBM buffer die and a second set of interconnection lines routed through the interposer between the HBM buffer die and the one or more HBM dies. For some examples, the FPGA die and the HBM buffer die share the same wafer-level substrate. For some examples, the FPGA die and the HBM buffer die are separated on the wafer-level substrate by a scribe line.

Yet another example of the present disclosure is a wafer. The wafer generally includes a plurality of logic regions, wherein each logic region comprises a programmable IC die paired with an interface die, the interface die for coupling the programmable IC die to a fixed feature die.

Yet another example of the present disclosure is an IC package. The IC package generally includes a package substrate; at least one interposer disposed above the package substrate; a programmable IC region disposed above the interposer; at least one fixed feature die disposed above the interposer; and an interface region disposed above the interposer and configured to couple the programmable IC region to the fixed feature die via a first set of interconnection lines routed through the interposer between a first plurality of ports of the interface region and the fixed feature die and a second set of interconnection lines routed between a second plurality of ports of the interface region and the programmable IC region.

Yet another example of the present disclosure is a method of fabricating an IC package. The method generally includes providing a mask for a programmable IC region paired with an interface region, the interface region for coupling the programmable IC region to at least one fixed feature die; generating, using the mask, a wafer having a plurality of the paired programmable IC and interface regions; dicing the wafer to detach a wafer section comprising one of the plurality of the paired programmable IC and interface regions; and disposing the wafer section above an interposer, wherein a first set of interconnection lines is routed through the interposer for electrically coupling a first plurality of ports of the interface region and the fixed feature die and wherein a second set of interconnection lines electrically couples a second plurality of ports of the interface region to the programmable IC region of the paired programmable IC and interface regions in the wafer section.

Yet another example of the present disclosure is a wafer. The wafer generally includes a plurality of logic regions, wherein each logic region comprises a programmable IC region paired with an interface region, the interface region for coupling the programmable IC region to a fixed feature die and comprising a first plurality of ports corresponding to the fixed feature die and a second plurality of ports corresponding to the programmable IC region.

Yet another example of the present disclosure is an apparatus. The apparatus generally includes a programmable IC region and an interface region configured to couple the programmable IC region to at least one fixed feature die via a first plurality of ports associated with the at least one fixed feature die and a second plurality of ports associated with the programmable IC region, wherein the interface region is configured as a switch network between the first plurality of ports and the second plurality of ports and wherein the switch network comprises a plurality of full crossbar switch networks.

Yet another example of the present disclosure is a method of fabricating an IC package. The method generally includes providing a mask for a programmable IC region paired with an interface region, the interface region for coupling the programmable IC region to at least one fixed feature die; generating, using the mask, a wafer having a plurality of the paired programmable IC and interface regions; dicing the wafer to detach a wafer section comprising one of the plurality of the paired programmable IC and interface regions; and disposing the wafer section above an interposer, wherein a first set of interconnection lines is routed through the interposer for electrically coupling a first plurality of ports of the interface region and the fixed feature die; a second set of interconnection lines electrically couples a second plurality of ports of the interface region to the programmable IC region of the paired programmable IC and interface regions in the wafer section; wherein the interface region is capable of configuration as a switch network between the first plurality of ports and the second plurality of ports; and wherein the switch network comprises a plurality of full crossbar switch networks.

Yet another example of the present disclosure is a wafer. The wafer generally includes a plurality of logic regions, wherein each logic region comprises a programmable IC region paired with an interface region, the interface region for coupling the programmable IC region to at least one fixed feature die and comprising a first plurality of ports corresponding to the at least one fixed feature die and a second plurality of ports corresponding to the programmable IC region, wherein the interface region is configured as a switch network between the first plurality of ports and the second plurality of ports and wherein the switch network comprises a plurality of full crossbar switch networks.

Yet another example of the present disclosure is a method for routing signals between an apparatus and a fixed feature die, the apparatus comprising a programmable IC region and an interface region configured to couple the programmable IC region to the fixed feature die. The method generally includes receiving, from the programmable IC region at a first port of the interface region, a signal having an address portion and a data portion, the first port being associated with the programmable IC region; and based on the address portion, routing at least the data portion of the signal through the interface region to a second port of the interface region, the second port being associated with the fixed feature die, wherein the interface region is configured as a switch network between the first port and the second port and wherein the switch network comprises a plurality of full crossbar switch networks.

These and other aspects may be understood with reference to the following detailed description.

BRIEF DESCRIPTION OF THE DRAWINGS

So that the manner in which the above-recited features of the present disclosure can be understood in detail, a more particular description of the disclosure, briefly summarized above, may be had by reference to examples, some of which are illustrated in the appended drawings. It is to be noted, however, that the appended drawings illustrate only typical examples of this disclosure and are therefore not to be considered limiting of its scope, for the disclosure may admit to other equally effective examples.

FIG. 16 is an example table defining the different access capabilities of each MU as illustrated in FIGS. 15A-15H, in accordance with an example of the present disclosure.

DETAILED DESCRIPTION

Examples of the present disclosure provide techniques and apparatus for adding one or more features (e.g., high bandwidth memory (HBM)) to an existing qualified stacked silicon interconnect (SSI) technology logic circuit (e.g., a programmable integrated circuit (IC), such as a super logic region (SLR)) without changing the logic circuit (e.g., adding or removing blocks). The application interface and plug-in additions to the logic circuit (e.g., an HBM buffer and controller) may be designed on the same mask set as if these were a single die, with a standard scribe line separating the application plug-in portion of the logic circuit die and the interface die. The connection between the application plug-in and the interface die may be made over the scribe using interposer interconnections.

Example Integrated Circuit Package

An integrated circuit (IC) die is typically disposed in a package for electrical connection with a circuit board (e.g., a printed circuit board (PCB)). The package protects the integrated circuit die from potential physical damage and moisture, which may lead to corrosion.

Figure 2:
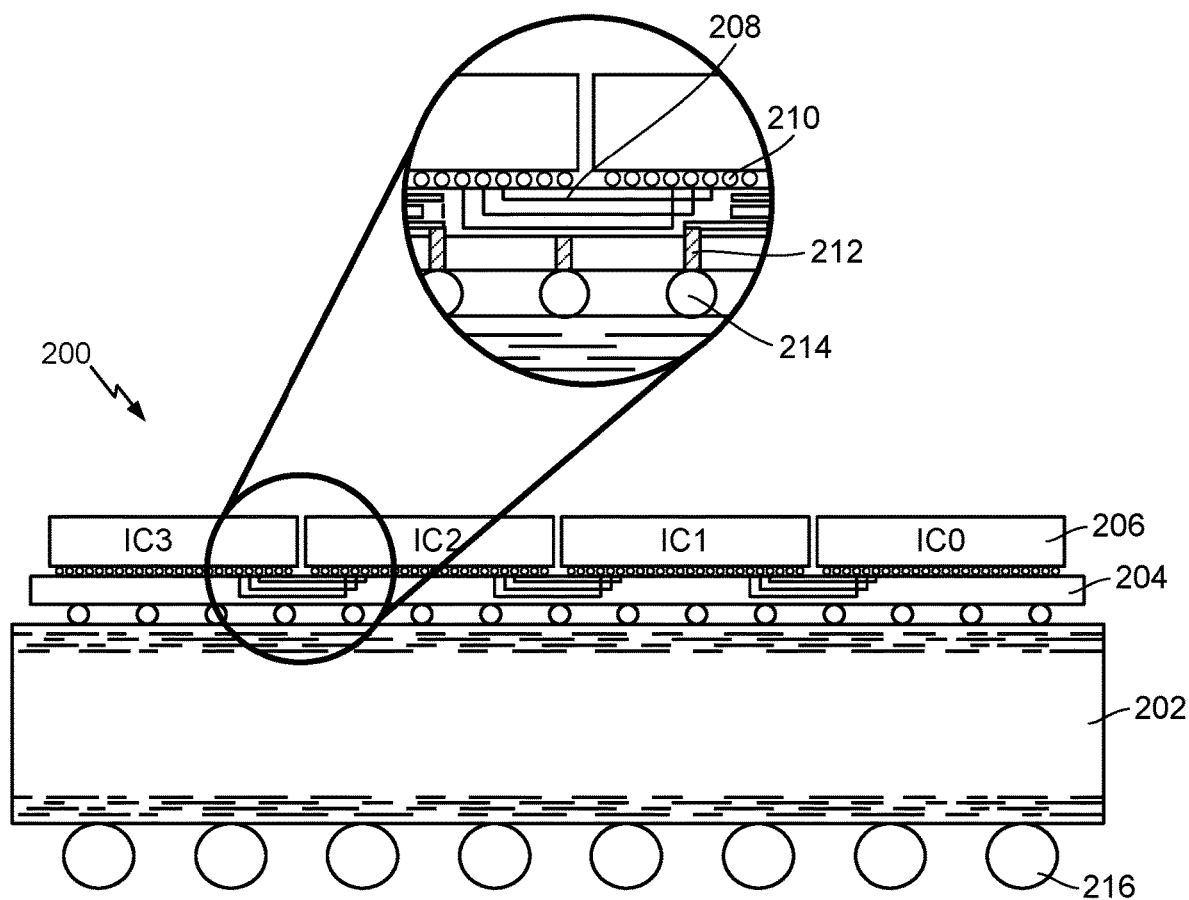
FIG. 2 is a cross-sectional view of an example integrated circuit (IC) package utilizing stacked silicon interconnect (SSI) technology, in accordance with the prior art.

FIG. 2 is a cross-sectional view of an example IC package 200 utilizing stacked silicon interconnect (SSI) technology. The IC package 200 includes a package substrate 202, an interposer 204 disposed above the substrate 202, a plurality of IC dies 206 disposed above the interposer 204, and an encapsulation material (not shown). The encapsulation material may be any of various suitable substances (e.g., resin) for encapsulating and protecting the IC dies 206. The IC dies 206 may include any of various suitable dies, including highly manufacturable field programmable gate array (FPGA) die slices, referred to as super logic regions (SLRs). Four IC dies 206 (IC0 to IC3) are illustrated in the example IC package 200 of FIG. 2, although the package may include more or less than four IC dies. SSI technology also allows dies of different types or silicon processes to be interconnected on the interposer 204.

The interposer 204 acts as an interconnect vehicle on which the IC dies 206 are set side by side and interconnected. The interposer 204 may be a passive silicon interposer, for example. Although only one interposer 204 is illustrated in FIG. 2, the IC package 200 may be implemented with multiple interposers in place of interposer 204 for some examples. The interposer 204 may include a plurality of interconnect lines 208, which may provide high-bandwidth, low-latency connections through the interposer 204. A plurality of microbumps 210 may be disposed above the interposer 204 for connecting electrically conductive pads of the IC dies 206 to the interconnect lines 208. The interposer 204 may also include a plurality of through-silicon vias (TSVs) 212 for routing connections between the IC dies 206 and a plurality of eutectic bumps 214 (e.g., controlled-collapse chip connection (C4) bumps) disposed between the interposer 204 and the package substrate 202. The TSVs 212 may provide the connections between the IC dies 206 and the substrate 202 for the parallel and serial I/O, power/ground, clocking, configuration signals, and the like. The plurality of eutectic bumps 214 electrically connect the interposer 204 to the substrate 202, and more particularly to conductive elements on the surface of and vias in the substrate.

The IC package 200 also has a plurality of solder balls 216 disposed below the package substrate 202. The solder balls 216 may be arranged, for example, in an array of rows and columns for making electrical contact with a matching arrangement of conductive pads disposed on a surface of a circuit board (e.g., a PCB).

Example Programmable Integrated Circuits

Many different types of integrated circuit (IC) dies 206 may be disposed on the interposer 204 and packaged in the IC package 200. One suitable type of IC is a programmable IC, such as a field programmable gate array (FPGA). An FPGA typically includes an array of programmable tiles. These programmable tiles may include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth. Another type of programmable IC is the complex programmable logic device, or CPLD. A CPLD includes two or more "function blocks" connected together and to input/output (I/O) resources by an interconnect switch matrix. Each function block of the CPLD includes a two-level AND/OR structure similar to those used in programmable logic arrays (PLAs) and programmable array logic (PAL) devices. Other programmable ICs are programmed by applying a processing layer, such as a metal layer, that programmably interconnects the various elements on the device. These programmable ICs are known as mask programmable devices. The phrase "programmable IC" can also encompass devices that are only partially programmable, such as application-specific integrated circuits (ASICs).

Figure 1:
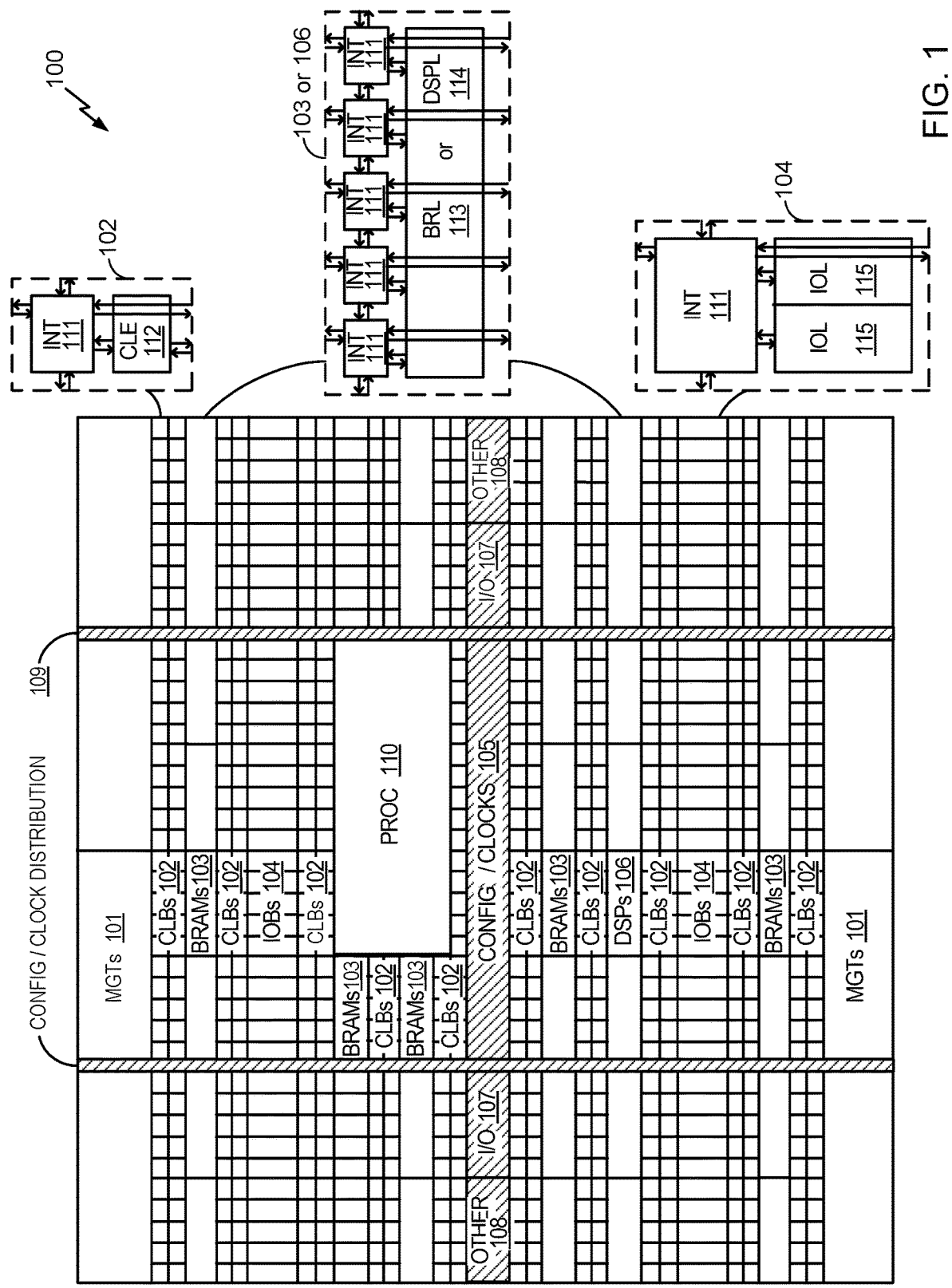
FIG. 1 is a block diagram illustrating an example architecture for a programmable device.

FIG. 1 is a block diagram illustrating an example architecture 100 for a programmable device, which may be implemented in the IC package 200 of FIG. 2. The architecture 100 may be implemented within a field programmable gate array (FPGA), for example. As shown, the architecture 100 includes several different types of programmable circuitry, e.g., logic, blocks. For example, the architecture 100 may include a large number of different programmable tiles including multi-gigabit transceivers (MGTs) 101, configurable logic blocks (CLBs) 102, random access memory blocks (BRAMs) 103, input/output blocks (IOBs) 104, configuration and clocking logic (CONFIG/CLOCKS) 105, digital signal processing (DSP) blocks 106, specialized I/O blocks 107 (e.g., configuration ports and clock ports), and other programmable logic 108, such as digital clock managers, analog-to-digital converters (ADCs), system monitoring logic, and the like.

In some FPGAs, each programmable tile includes a programmable interconnect element (INT) 111 having standardized connections to and from a corresponding INT 111 in each adjacent tile. Therefore, the INTs 111, taken together, implement the programmable interconnect structure for the illustrated FPGA. Each INT 111 also includes the connections to and from the programmable logic element within the same tile, as shown by the examples included at the far right of FIG. 1.

For example, a CLB 102 may include a configurable logic element (CLE) 112 that can be programmed to implement user logic plus a single INT 111. A BRAM 103 may include a BRAM logic element (BRL) 113 in addition to one or more INTs 111. Typically, the number of INTs 111 included in a tile depends on the width of the tile. In the pictured example, a BRAM tile has the same width as five CLBs, but other numbers (e.g., four) can also be used. A DSP block 106 may include a DSP logic element (DSPL) 114 in addition to an appropriate number of INTs 111. An IOB 104 may include, for example, two instances of an I/O logic element (IOL) 115 in addition to one instance of an INT 111. As will be clear to a person having ordinary skill in the art, the actual I/O pads connected, for example, to the IOL 115 typically are not confined to the area of the IOL 115.

In the example architecture 100 depicted in FIG. 1, a horizontal area near the center of the die (shown shaded in FIG. 1) is used for configuration, clock, and other control logic (CONFIG/CLOCKS 105). Other vertical areas 109 extending from this central area may be used to distribute the clocks and configuration signals across the breadth of the FPGA.

Some FPGAs utilizing the architecture 100 illustrated in FIG. 1 include additional logic blocks that disrupt the regular row structure making up a large part of the FPGA. The additional logic blocks may be programmable blocks and/or dedicated circuitry. For example, a processor block depicted as PROC 110 spans several rows of CLBs 102 and BRAMs 103.

The PROC 110 may be implemented as a hard-wired processor that is fabricated as part of the die that implements the programmable circuitry of the FPGA. The PROC 110 may represent any of a variety of different processor types and/or systems ranging in complexity from an individual processor (e.g., a single core capable of executing program code) to an entire processing system having one or more cores, modules, co-processors, interfaces, or the like.

In a more complex arrangement, for example, the PROC 110 may include one or more cores (e.g., central processing units), cache memories, a memory controller, unidirectional and/or bidirectional interfaces configurable to couple directly to I/O pins (e.g., I/O pads) of the IC and/or couple to the programmable circuitry of the FPGA. The phrase "programmable circuitry" can refer to programmable circuit elements within an IC (e.g., the various programmable or configurable circuit blocks or tiles described herein) as well as the interconnect circuitry that selectively couples the various circuit blocks, tiles, and/or elements according to configuration data that is loaded into the FPGA. For example, portions shown in FIG. 1 that are external to the PROC 110 may be considered part of the, or the, programmable circuitry of the FPGA.

FIG. 1 is intended to illustrate an example architecture 100 that can be used to implement an FPGA that includes programmable circuitry (e.g., a programmable fabric) and a processing system. For example, the number of logic blocks in a row, the relative width of the rows, the number and order of rows, the types of logic blocks included in the rows, the relative sizes of the logic blocks, and the interconnect/logic implementations included at the right of FIG. 1 are exemplary. In an actual FPGA, for example, more than one adjacent row of CLBs 102 is typically included wherever the CLBs appear, in an effort to facilitate the efficient implementation of a user circuit design. The number of adjacent CLB rows, however, can vary with the overall size of the FPGA. Further, the size and/or positioning of the PROC 110 within the FPGA is for purposes of illustration only and is not intended as a limitation of the one or more examples of the present disclosure.

Example Standalone Interface for SSI Technology Integration

As described above, stacked silicon interconnect (SSI) technology devices use an interposer to connect multiple integrated circuit (IC) dies together using fine microbumps and metal traces much denser than what is available in conventional IC package technology or PCB technology. It may be desirable to take advantage of SSI technology for certain applications by connecting a fixed feature die (e.g., an ASIC) with an additional capability to a programmable IC die (e.g., an FPGA SLR) with connections substantially denser and faster than allowed using traditional I/O connected to package pins over a PCB. For some examples, if the additional capability is to be added to the programmable IC die, then additional circuitry (e.g., buffers) may need to be added to the programmable IC die that is connected to the fixed feature die to interface with the microbumps with a function and pattern consistent with the fixed feature die. For certain applications, the large number of additional connections it would take to support the new capability may be very disruptive to the programmable IC architecture, and may involve the removal of logic and/or DSP blocks and alterations to the clocking network. When such changes are made to an existing, working programmable IC die, it may be desirable to completely requalify the entirely die, which is complex and costly.

Examples of the present disclosure avoid this disruption and requalification of the programmable IC architecture and instead leave the programmable IC die unchanged. An interface die is designed that is compatible with the interposer interconnect data and clocking microbumps and interconnect pattern of the programmable IC die (e.g., an FPGA SLR) on one side and with the microbumps and interconnect pattern of the fixed feature die(s) on the other side. The interface die functions to convert the fixed feature protocol to an interposer interconnection compatible protocol. The programmable IC die and the interface die may share the same wafer-level substrate (e.g., the same monolith of semiconducting material) after wafer dicing, but may be separated by a scribe line (a standard scribe).

Figure 3A:
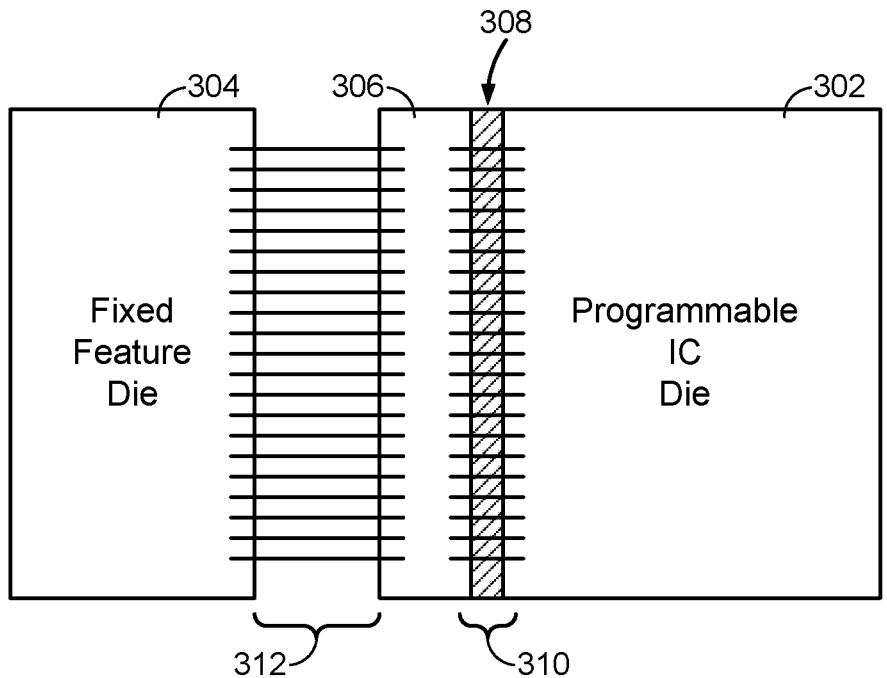
FIGS. 3A and 3B illustrate a top view and a cross-sectional view, respectively, of a portion of an example IC package comprising a programmable IC die coupled to a fixed feature die via an interface die, in accordance with examples of the present disclosure.
Figure 3B:
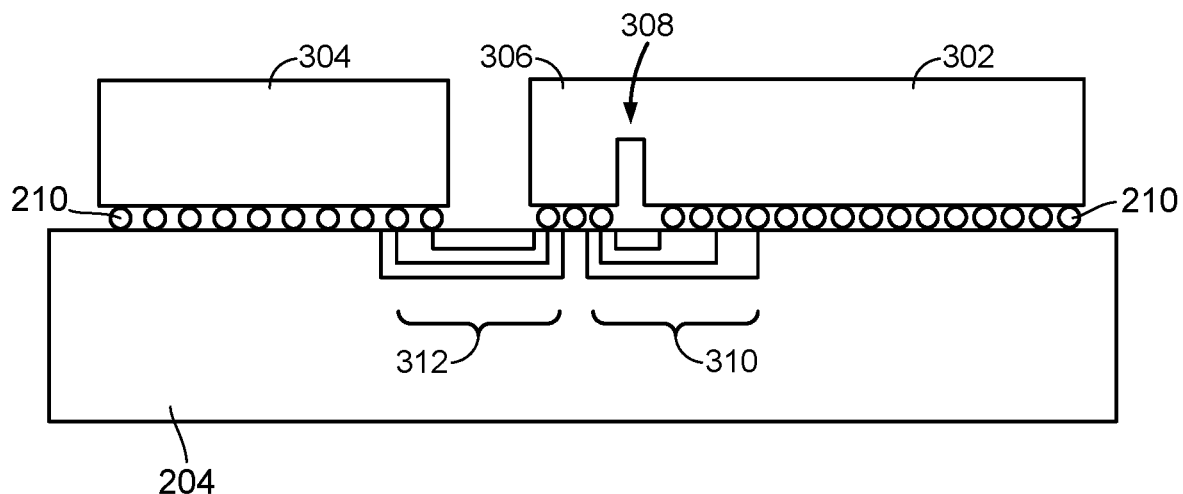

FIGS. 3A and 3B illustrate a top view and a cross-sectional view, respectively, of a portion of an example IC package (e.g., at the interposer level) comprising a programmable IC die 302 coupled to a fixed feature die 304 via an interface die 306, in accordance with examples of the present disclosure. A mask may be used to generate a wafer with the several instances of the programmable IC die 302 paired with the interface die 306. After dicing, the programmable IC die 302 and the interface die 306 may share the same wafer-level substrate, as illustrated in FIG. 3B. A scribe line 308 may separate the interface die 306 from the programmable IC die 302, and there may be no direct electrical connections between the two dies through the wafer section. Instead, a first set of interconnect lines 310 through the interposer 204 may be used to electrically connect circuits in the programmable IC die 302 and the interface die 306. One side of the interface die 306 is designed to be compatible with a pattern of the microbumps 210 and the first set of interconnect lines 310 for the programmable IC die 302. A second set of interconnect lines 312 routed through the interposer 204 may be used to electrically connect circuits in the fixed feature die 304 and the interface die 306. Another side of the interface die is designed to be compatible with a pattern of the microbumps 210 and the second set of interconnect lines 312 for the fixed feature die 304. In this manner, the design of the interface die 306 and the use of the interconnect lines 208 in the interposer 204 permit integrating the additional capability of the fixed feature die 304 into the SSI technology IC package, without any change to the programmable IC die 302. Therefore, an existing, working programmable IC die need not be requalified.

One example application that may utilize SSI technology includes High Bandwidth Memory (HBM). HBM is a high-performance random access memory (RAM) instance for three-dimensional (3-D) stacked dynamic RAM (DRAM), which may be used in any of various suitable applications, such as high-performance graphics accelerators and network devices. In HBM, up to eight DRAM dies may be stacked, which may be interconnected by through-silicon vias (TSVs) and microbumps.

HBM devices may take advantage of SSI technology to connect DRAM to a programmable IC die (e.g., an FPGA die) eight to ten times (8 to 10×) denser and faster than traditional DRAM allows using traditional I/O connected to package pins over a PCB. If HBM is to be added to an FPGA, then it may be desirable to add buffers to the FPGA that is connected to the HBM. These buffers would drive the microbumps with a function and pattern consistent with a neighboring HBM. The data coming from an HBM would have a very high bandwidth (e.g., 6 terabits per second (Tbps) per HBM device). Adding the tens of thousands of desired connections to the FPGA would be very disruptive to the FPGA architecture, involving removal of logic and DSP blocks from the regularity of the FPGA fabric to add connections from the HBM buffer. The addition may also disrupt the FPGA clocking network. Besides having to design a new HBM buffer, the IC manufacturer may also develop new blocks related to clocking, CLE, and/or DSP in an effort to add HBM support. As described above, the qualification of an FPGA (SLR) is very complex. Furthermore, it is expected that the HBM standard will change over the life of a typical FPGA product. A change to the standard may entail the redesign of the HBM buffer and the entire FPGA (SLR) and a complete requalification.

Examples of the present disclosure leave the FPGA (SLR) unchanged. An HBM buffer die may be designed that is compatible with the interposer interconnect data and clocking microbumps and interconnect pattern of the FPGA (SLR) on one side and with the microbumps and interconnect pattern of the HBM memory (or memories) on the other side. The function of the HBM buffer die is to convert HBM protocol to an interposer interconnect compatible protocol like AXI (Advanced eXtensible Interface). The FPGA and HBM buffer devices may share the same wafer-level substrate, but may be separated by a scribe line, as described above. Although an HBM application and an HBM buffer die are used as examples throughout the present disclosure, it is to be understood that any suitable application (and application-specific integrated circuit (ASIC) die) may be integrated in an SSI technology IC package using a suitable interface die.

Figure 4:
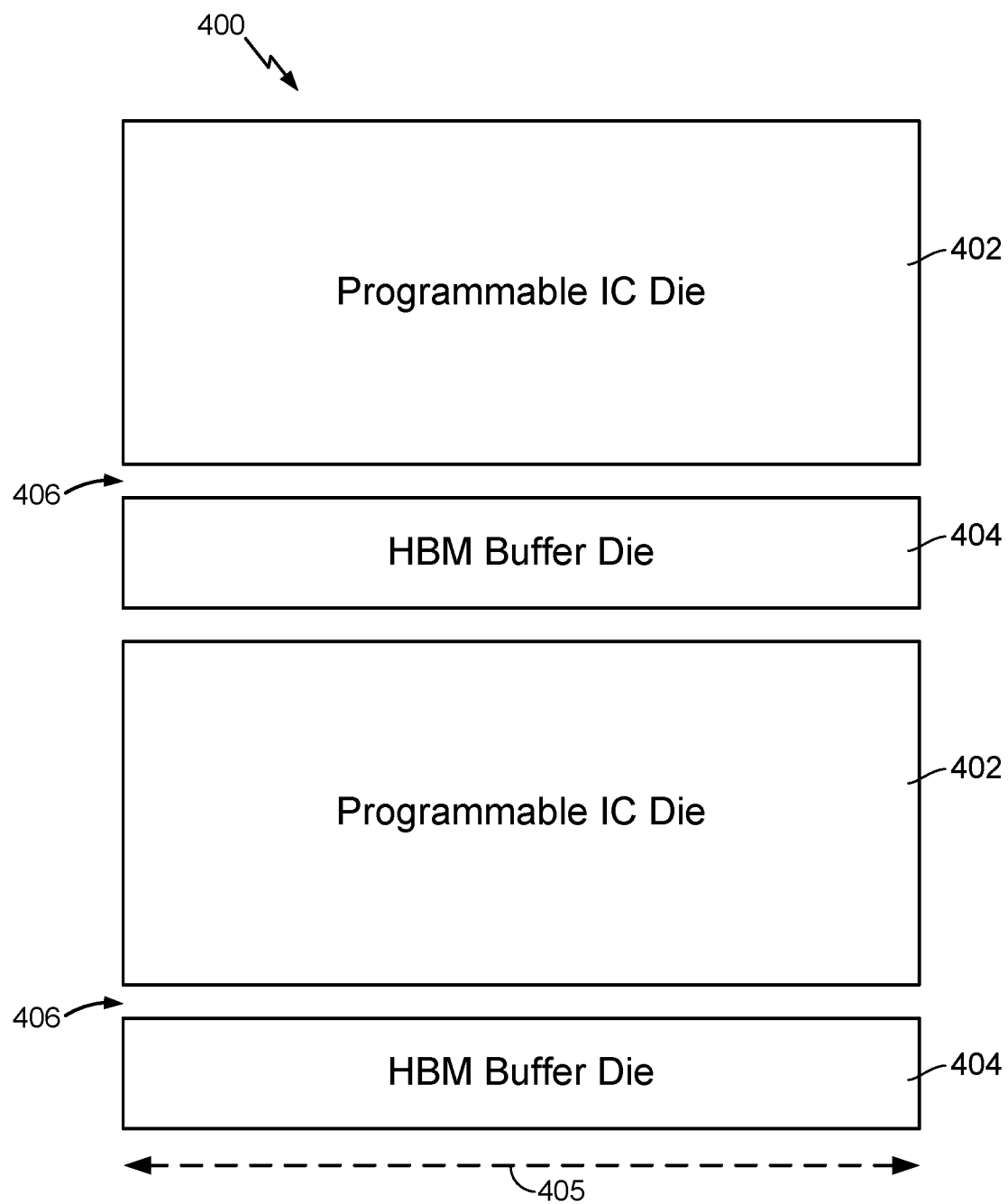
FIG. 4 illustrates an example mask for a pair of logic regions, each logic region including a programmable IC die and a high bandwidth memory (HBM) buffer die, in accordance with an example of the present disclosure.

FIG. 4 illustrates an example mask 400 for a pair of logic regions, in accordance with an example of the present disclosure. Each logic region includes a programmable IC die 402 and an HBM buffer die 404. Although a pair of logic regions are illustrated in the example mask 400 of FIG. 4, a mask may have only one logic region or more than two logic regions. FIG. 4 shows the programmable IC die 402 and the HBM buffer die 404 as having the same width 405 and being separated by a scribe line 406. This scribe line 406 may have a standard width. For other examples, the HBM buffer die 404 may have a different width than the programmable IC die 402. The HBM buffer die 404 and the programmable IC die 402 may have compatible interposer interconnect microbump patterns. The mask 400 in FIG. 4 may be used to make the wafers shown in FIGS. 5A and 5B.

Figure 5B:
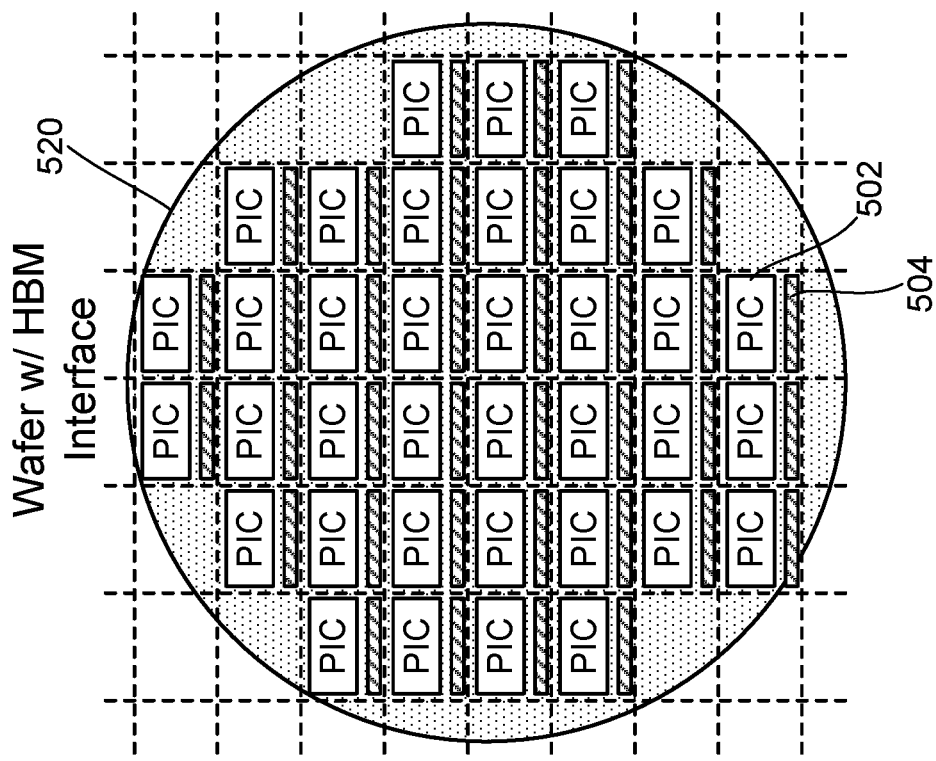
FIG. 5B is a top view of the wafer of FIG. 5A, illustrating the scribe cuts where the wafer is diced, leaving the HBM buffer die paired with the programmable IC die to create a logic region with an HBM interface, in accordance with an example of the present disclosure.
Figure 5A:
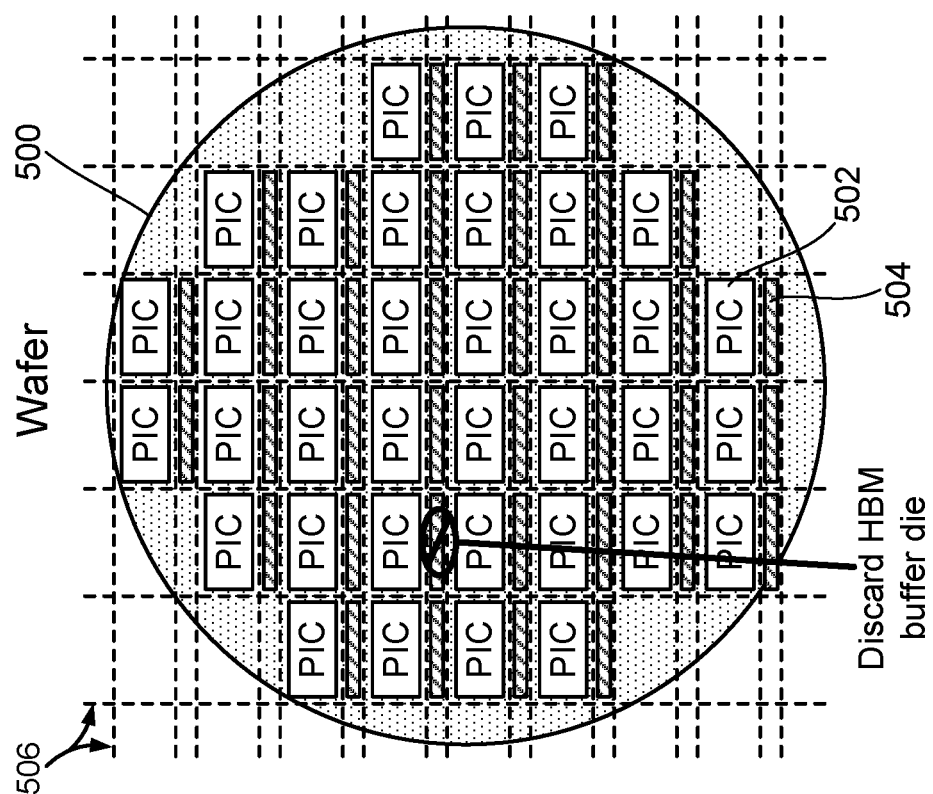
FIG. 5A is a top view of a wafer with programmable IC dies paired with HBM buffer dies, illustrating the scribe cuts where the HBM buffer dies are separated from the programmable IC dies to create logic regions, in accordance with an example of the present disclosure.

FIGS. 5A and 5B illustrate how one mask set can be used to make two different logic regions. FIG. 5A is a top view of a wafer 500 with logic regions (e.g., SLRs) including programmable IC die 502 paired with an HBM buffer die 504, in accordance with an example of the present disclosure. The dashed lines 506 represent scribe cuts where the wafer 500 is diced, and the HBM buffer die 504 is separated from the programmable IC (PIC) die 502. The wafer 500 in FIG. 5A can be used to produce, for example, traditional SSI technology FPGA SLRs. The separated HBM buffer dies 504 may be discarded.

FIG. 5B is a top view of a wafer 520 with an HBM interface, in accordance with an example of the present disclosure. The wafer 520 may be the same starting wafer as the wafer 500 of FIG. 5A, but the scribe cuts are different. The wafer 520 in FIG. 5B is diced such that the PL die 502 and the HBM buffer die 504 are paired together as a single logic region (e.g., SLR). The HBM buffer and PL portions may be separated by a scribe and may not have any direct electrical connections in the diced wafer section. Rather, the connections between the two portions may be made by interconnect lines in the SSI interposer.

These interconnect lines 310 in the interposer 204 are designed to create wide, high-bandwidth connections between dies. Further, the interconnect lines 310 may be designed to distribute the bandwidth of the connection over enough of the programmable logic (e.g., FPGA) to absorb the astounding bandwidth of HBM. The separation (e.g., by a scribe line) of the programmable IC die and the HBM buffer die also serves to reduce the risk and increase vendor flexibility. In this manner, a problem with the HBM or HBM buffer die or a change in the HBM standard will not impact the usefulness of the programmable logic. Further, if the HBM design is changed due to HBM vendor differences or the evolution of the HBM standard, the programmable logic need not be disturbed. This will save an immense amount of qualification time, especially since the HBM-to-PIC connection over the interposer interconnect lines 310 may be soft and may not involve a mask change to modify. This soft connection over the interconnect lines 310 may be implemented with bidirectional drivers at the ends of each interconnect line, which can be controlled to adjust which lines are connected.

Figure 6:
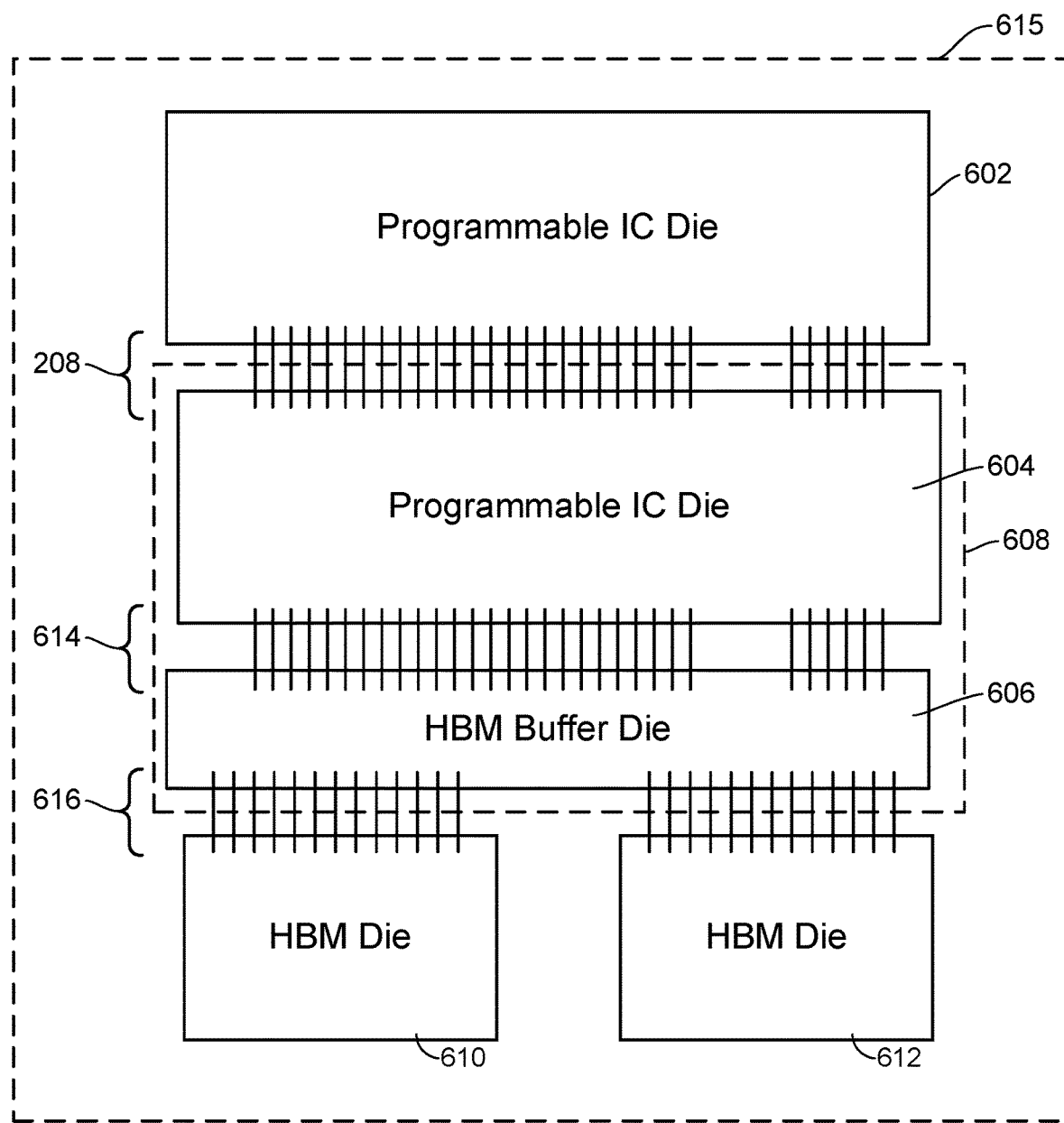
FIG. 6 illustrates a top view of a portion of an example IC package utilizing SSI technology comprising a first logic region, a second logic region with an HBM interface, and HBM dies, in accordance with an example of the present disclosure.

FIG. 6 illustrates a top view of a portion of an example IC package (e.g., at the interposer level) utilizing SSI technology, in accordance with an example of the present disclosure. The portion of the IC package includes a first logic region 602 (comprising a first programmable IC die)

coupled to a second logic region 608 (comprising a second programmable IC die 604 paired with an HBM buffer die 606), where the second logic region may be referred to as a logic region with an HBM interface. The HBM buffer die 606 is coupled to two HBM dies 610, 612. Although the programmable IC die 604 and the HBM buffer die 606 are independent, these dies may be diced from a wafer as a single logic region 608. The two dies 604, 606 in the second logic region 608 may be connected using a first set of interconnection lines 614 routed through the interposer 615. The interconnection lines 614 routed between the programmable IC die 604 and the HBM buffer die 606 may be the same type as the interconnect lines 208 used between the IC dies 206 in FIG. 2. For some examples, the HBM channel may entail 1440 interconnect signals at 500 megabits per second (Mbps) with 8 channels per device. Thus, there may be 16 programmable IC interconnect channels with 1440 signals between the logic region 602 and the logic region 608. The interconnection lines 616 between the HBM buffer die 606 and the HBM dies 610, 612 may use the HBM JEDEC standard on the interposer 204. For some examples, there may be 212 interconnection lines per HBM channel at 2 gigabits per second (Gbps) with 8 channels per HBM device.

Figure 7:
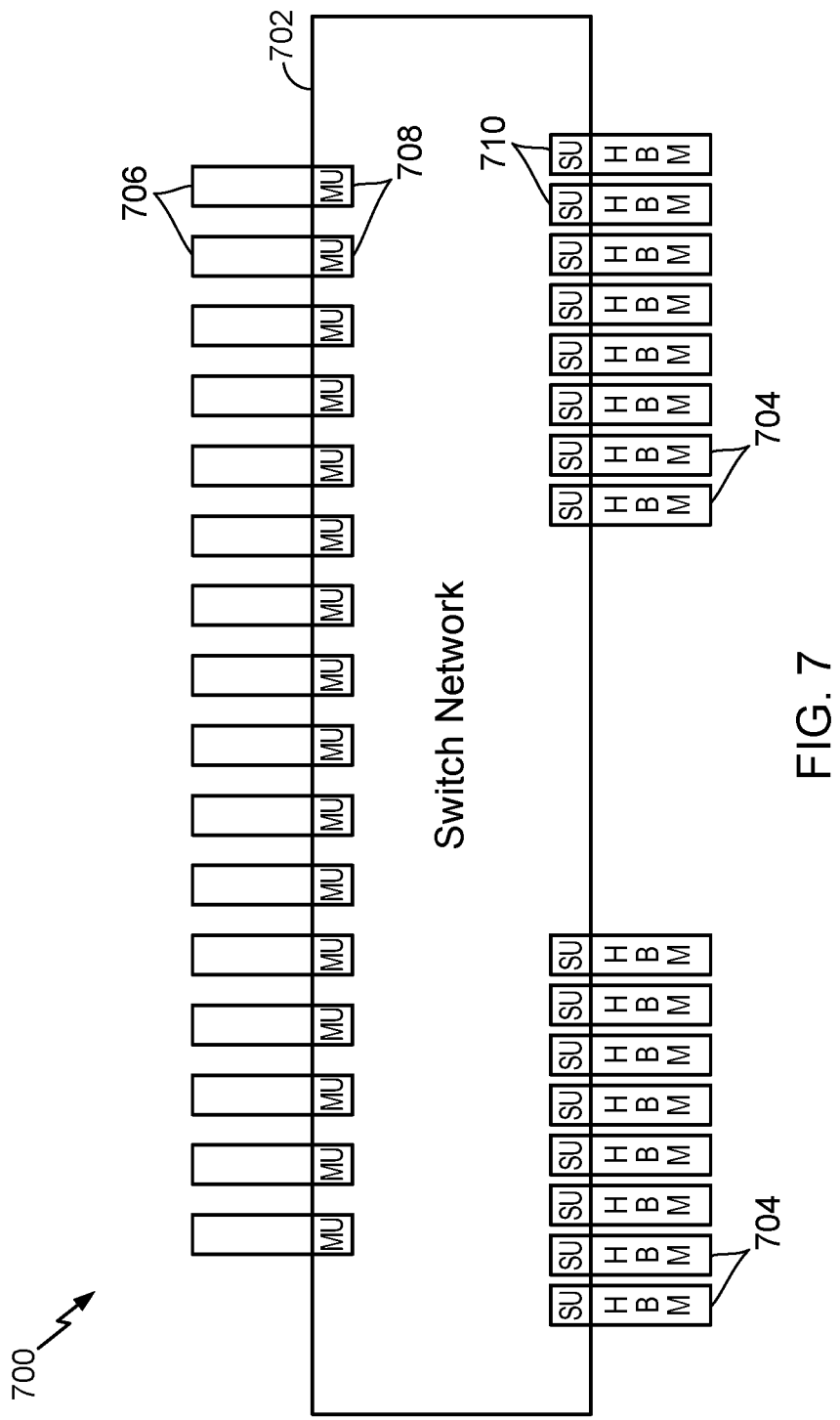
FIG. 7 is a block diagram of an example HBM buffer die, in accordance with an example of the present disclosure.

The interposer interconnections on a suitable process (e.g., 65 nm or smaller) may be very compatible with HBM bandwidth and density. FIG. 7 shows the top level design of an example HBM buffer die 700, in accordance with an example of the present disclosure. The HBM buffer die 700 may be one example implementation of the HBM buffer die 606 in FIG. 6. The signal count and bandwidth coming from the HBM die 610, 612 are nicely balanced by the interconnection signal bandwidth to the programmable IC (e.g., an FPGA). The circuit may have a switch network 702 (e.g., an AXI switch network) between the HBM channels 704 and the programmable IC interconnect channels 706. The HBM design also allows the HBM placement and the programmable IC interconnect placement to be independent.

Each master unit (MU) 708 in FIG. 7 may be, for example, a 512-bit AXI bus running at 500 MHz, which may take up most of the 1440 signals in a programmable IC interconnect channel 706. The slave unit (SU) 710 in each HBM output may also be, for example, a 512-bit AXI bus operating at 500 MHz. A HBM application of 128 bits at 2 gigabits per second (Gbps) may result in an AXI 512-bit interface at 500 MHz.

With examples of the present disclosure, HBM memory or another suitable capability can be added to an existing qualified SSI technology logic circuit without changing the logic circuit (e.g., adding or removing blocks). The application interface and plug-in additions to the logic circuit (e.g., an HBM buffer and controller) may be designed on the same mask set as if these were a single die, with a standard scribe line separating the application plug-in portion of the logic circuit die and the interface die. The connection between the application plug-in and the interface die may be made over the scribe using interposer interconnections.

There are numerous advantages provided by the standalone interface approach, according to examples of the present disclosure. Since programmable IC dies may have multiple tapeouts (e.g., engineering samples and production), the interface die (e.g., the HBM buffer die) can be added to any tapeout including production with no additional mask cost. Introducing support for additional features (e.g., HBM support) to a programmable IC (e.g., an FPGA) need not involve designing a new programmable IC and the subsequent modeling and qualification. Since interposer interconnections are already supported and modeled, adding capabilities (e.g., HBM) need not entail any additional work from various groups at the IC package designer and/or manufacturer. It may be possible for only one group to design the interface die (e.g., the HBM buffer die) knowing the design guidelines (e.g., the HBM standard) and the pattern for the interconnection signals on the programmable IC. The design may also be very portable to an outside vendor. Future changes to the design (e.g., revisions to the HBM standard) need not impact programmable IC design or qualification. The standalone interface design may be applied to any logic circuit with interconnect support.

Example Operations for Fabricating an IC Package

Figure 8:
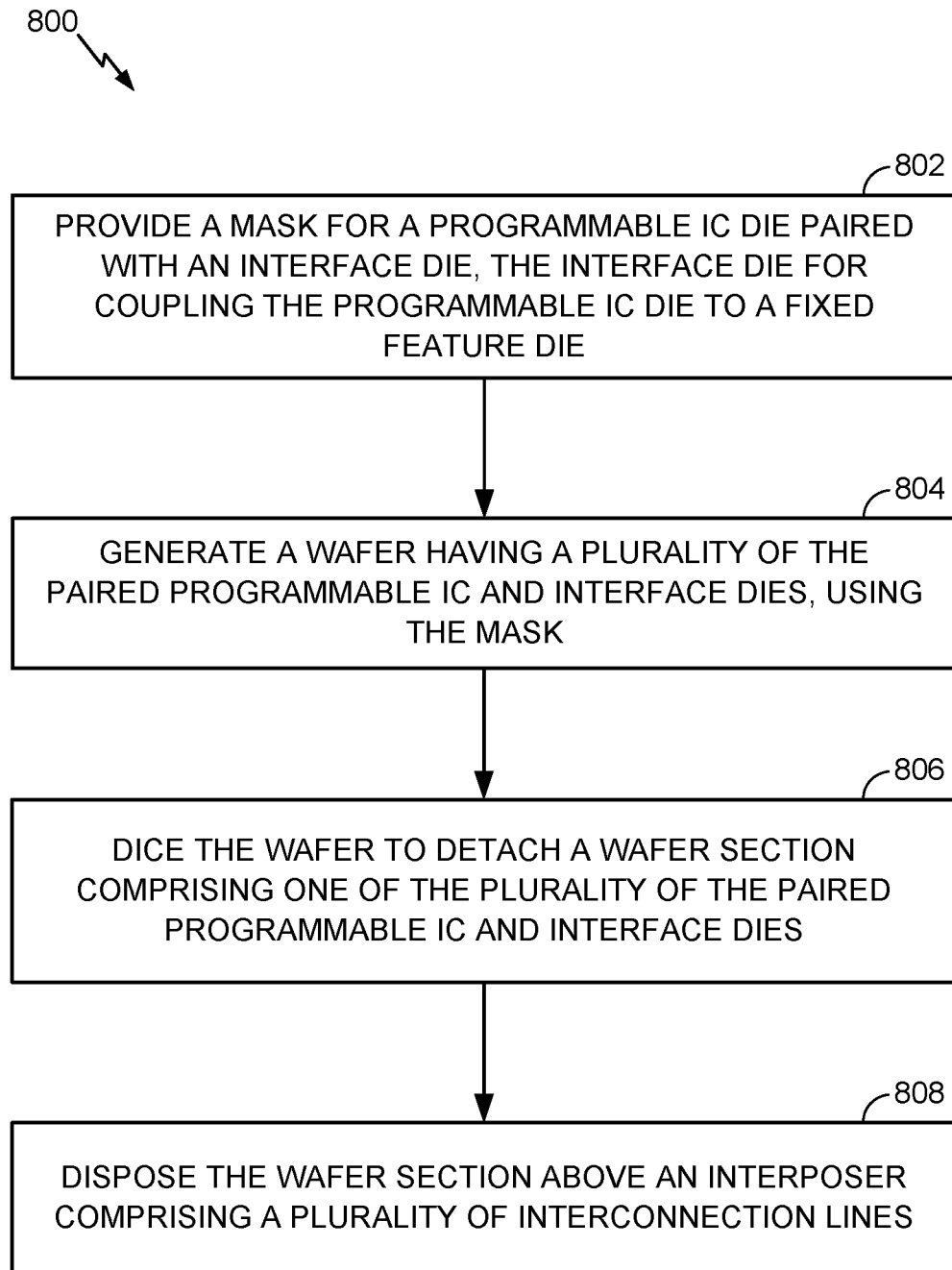
FIG. 8 is a flow diagram of example operations for fabricating an IC package, in accordance with an example of the present disclosure.

FIG. 8 is a flow diagram of example operations 800 for fabricating an IC package, in accordance with an example of the present disclosure. The operations 800 may be performed, for example, by a system for fabricating the IC package, which may include a semiconductor processing chamber.

The operations 800 may begin, at block 802, by providing a mask for a programmable IC die paired with an interface die. The interface die is for coupling the programmable IC die to at least one fixed feature die. At block 804, the mask is used to generate a wafer having a plurality of the paired programmable IC and interface dies. At block 806, the wafer may be diced to detach a wafer section comprising one of the plurality of the paired programmable IC and interface dies. At block 808, the wafer section may be disposed above an interposer comprising a plurality of interconnection lines. A first set of the interconnection lines may be routed through the interposer for electrically connecting the paired programmable IC and interface dies in the wafer section. A second set of the interconnection lines may be routed through the interposer for electrically connecting the interface die and the fixed feature die.

According to some examples, the operations 800 may further entail disposing the fixed feature die above the interposer. For some examples, the operations may further involve disposing the interposer above a package substrate and/or encapsulating the fixed feature die, the wafer section, the interposer, and at least a portion of the package substrate to form the integrated circuit package. For some examples, a plurality of microbumps may be disposed above the interposer. In this case, the plurality of microbumps may electrically connect the interconnection lines routed through the interposer with circuits in the programmable IC die, the interface die, and the fixed feature die. For some examples, the interface die in the wafer section is compatible with a first pattern of the microbumps and the first set of interconnection lines for the programmable IC die and compatible with a second pattern of the microbumps and the second set of interconnection lines for the fixed feature die.

According to some examples, the operations 800 may further include forming a scribe line between the programmable IC die and the interface die in each of the paired programmable IC and interface dies.

According to some examples, the paired programmable IC and interface dies in the wafer section share the same wafer-level substrate.

According to some examples, the fixed feature die comprises an HBM die. In this case, the interface die may comprise an HBM buffer die. For some examples, the second set of interconnection lines is in accordance with the HBM JEDEC standard.

According to some examples, the fixed feature die comprises an application-specific integrated circuit (ASIC).

According to some examples, there are no electrical connections between the paired programmable IC and interface dies in the wafer section, other than through the interconnection lines routed through the interposer.

Example HBM Bandwidth Aggregation Switch

As described above, HBM is a high-performance RAM instance for 3-D DRAM, which may be used in any of various suitable applications, such as high-performance graphics accelerators and network devices. In HBM, up to eight DRAM dies may be stacked, which may be interconnected by through-silicon vias (TSVs) and microbumps. HBM devices may take advantage of SSI technology to connect stacked DRAM to a programmable IC die eight to ten times (8 to 10×) denser and faster than traditional DRAM allows using traditional I/O connected to package pins over a PCB. One HBM device can have 16 pseudo memory channels, each with the same bandwidth as a 1600 Mbps 64-bit double data rate (DDR) dual in-line memory module (DIMM), which is a considerably high bandwidth.

However, each memory channel in HBM goes to an isolated memory array, and each HBM channel can only access memory with addresses in its partition. To fully utilize all bandwidth and bits of an HBM device, a system may have, for example, 16 independent agents accessing each channel. If a system in the programmable IC has only four agents, it may be very difficult to connect groups of channels to each agent to use all bits and bandwidth. The aggregation of HBM channels to each agent may employ substantial fabric resources in the programmable IC, which may be made more challenging by the bandwidth requirements of HBM. Without an HBM switch (e.g., the switch network 702), each HBM pseudo channel may be connected to the programmable IC fabric through an interface between the fabric logic and other logic and input/output (I/O) on the boundary of the programmable IC die (referred to as a boundary logic interface (BLI)). The BLI may allow the very large and complex HBM pseudo channel logic and I/O to be perceived as a much smaller block, such as a CLE or DSPL (e.g., CLE 112 or DSPL 114 in FIG. 1) in the fabric array of the programmable IC.

Examples of the present disclosure utilize a switch (e.g., switch network 702) between the programmable IC interconnect channels (e.g., FPGA BLI) and the HBM pseudo channels (PCs). For some examples, the switch may allow any programmable IC interconnect channel to access any HBM pseudo channel(s). Therefore any interconnect channel could access any bit in the HBM, regardless of from which pseudo channel the bit is accessed.

In the current PCB-based design environment, having four 64-bit DDR DIMMs pushes the limit of package and PCB technology. For some examples, a programmable IC with HBM may allow the equivalent of sixteen 64-bit DDR DIMMs connected thereto. It is likely that some customers and applications will find a use for 16 HBM interfaces, but most applications will continue to use 4 interfaces or may double this to 8. Thus, a customer desiring 4 memories may combine the bandwidth and bits of 4 HBM pseudo channels to make a virtual memory. It is to be understood that many combinations are possible, from four groups of 4 to one group of 13 and three groups of 1, etc. Each HBM pseudo channel (PC) may enter the fabric region of the programmable IC through a BLI, which may be a 256-bit full duplex AXI bus running at 500 MHz. Combining four HBM pseudo channel BLI may consume significant resources of the programmable IC and may have very difficult timing closure. Hardening a switch between the programmable IC interconnect channels (e.g., FPGA BLI) and the HBM PCs may save fabric resources and remove timing closure issues.

There are two major characteristics that an ideal switch network should have. First, in an idyllic case, every BLI master input to the switch network has access to any and all HBM pseudo channel slave ports. Second, in the case where each BLI is connected directly to one and only one HBM PC (also referred to as "the affinity case"), the latency through the switch network should be minimal.

Figure 9:
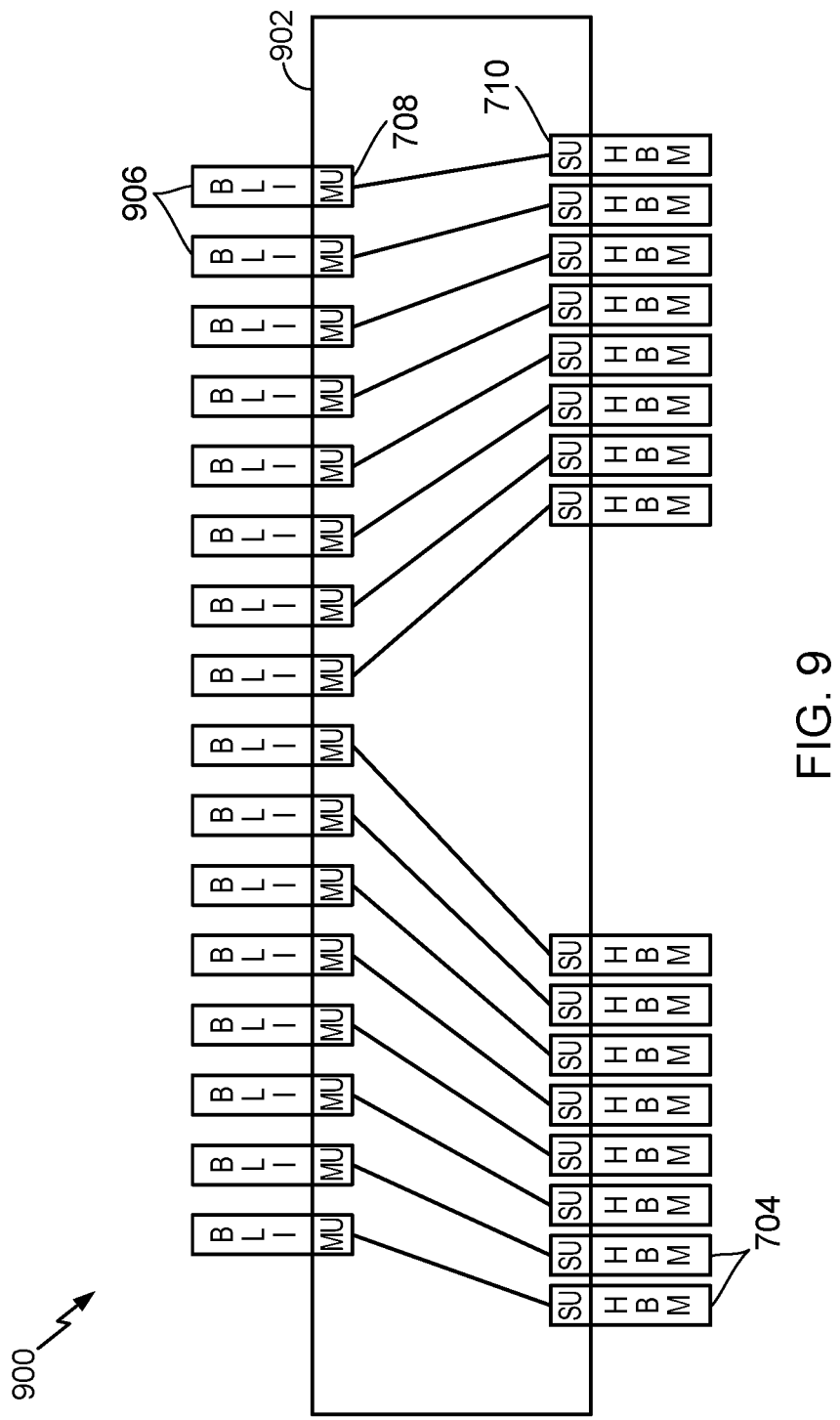
FIG. 9 is a block diagram of an example HBM buffer region in which each programmable IC interconnect channel is connected to one and only one HBM channel, in accordance with an example of the present disclosure.

FIG. 9 is a block diagram of an example HBM buffer region 900 for the affinity case, in accordance with an example of the present disclosure. The circuit may have a switch network 902 between the HBM channels 704 (e.g., HBM PCs) and the programmable IC interconnect channels 906 (e.g., BLI ports). In the switch network 902, each programmable IC interconnect channel 906 is connected to directly to one and only one HBM channel 704.

The affinity case of FIG. 9 is an application that uses the maximum bandwidth available from the HBM device(s). An application using the affinity case may expect the minimum latency possible. For other HBM buffer regions described below, it may be an option to effectively bypass the switch for minimum latency by configuring the switch network 902 to operate in the affinity case illustrated in FIG. 9.

Similar to other examples described above, the HBM buffer regions described herein (including HBM buffer region 900) may be compatible with the interposer interconnect data and clocking microbumps and interconnect pattern of the programmable IC on one side and with the microbumps and interconnect pattern of the HBM memory (or memories) on the other side. The function of the HBM buffer region is to convert HBM protocol to an interposer interconnect compatible protocol like AXI (Advanced eXtensible Interface). For some examples, the programmable IC and HBM buffer region 900 may share the same wafer-level substrate, but may be separated by a scribe line and rely on an interposer for connection therebetween, as described above. In this case, the HBM buffer region 900 may be a separate HBM buffer die. For other examples, the HBM buffer region 900 may be integrated with the programmable IC in a single, monolithic die. In this case, the programmable IC and HBM buffer need not rely on the interposer for connection therebetween, and there may be no electrical connections routed through the interposer to connect the programmable IC and the HBM buffer, for some examples. Instead, IC metallization may be used to connect the HBM buffer circuitry with the programmable IC circuitry. The IC metallization may utilize one or more metallization layers. For other examples, a combination of IC metallization and interposer interconnect lines may be utilized to connect the programmable IC circuitry with the HBM buffer circuitry.

The switch network 902 may be, for example, an AXI type switch network or a packet-protocol type switch network. In an AXI type switch network, signals may be driven from each master unit 708 and multiplexed onto a common address/data/control bus by a multiplexer (MUX) controlled by an arbiter. The output of the multiplexer may be fanned-out to the slave units 710. The bus transfers data, address, and control signals separately through the MUX structure. The address and control along with the arbitration system directs data buses through a series of MUXes and buffers from a master unit 708 to a slave unit 710. In a packet-protocol type switch network, data, address, and control may be combined in a packet with a set of flow control digits (also referred to as "flits"). The packet may be sent, for example, from a master unit 708 to a slave unit 710 based on the flits.

Figure 10:
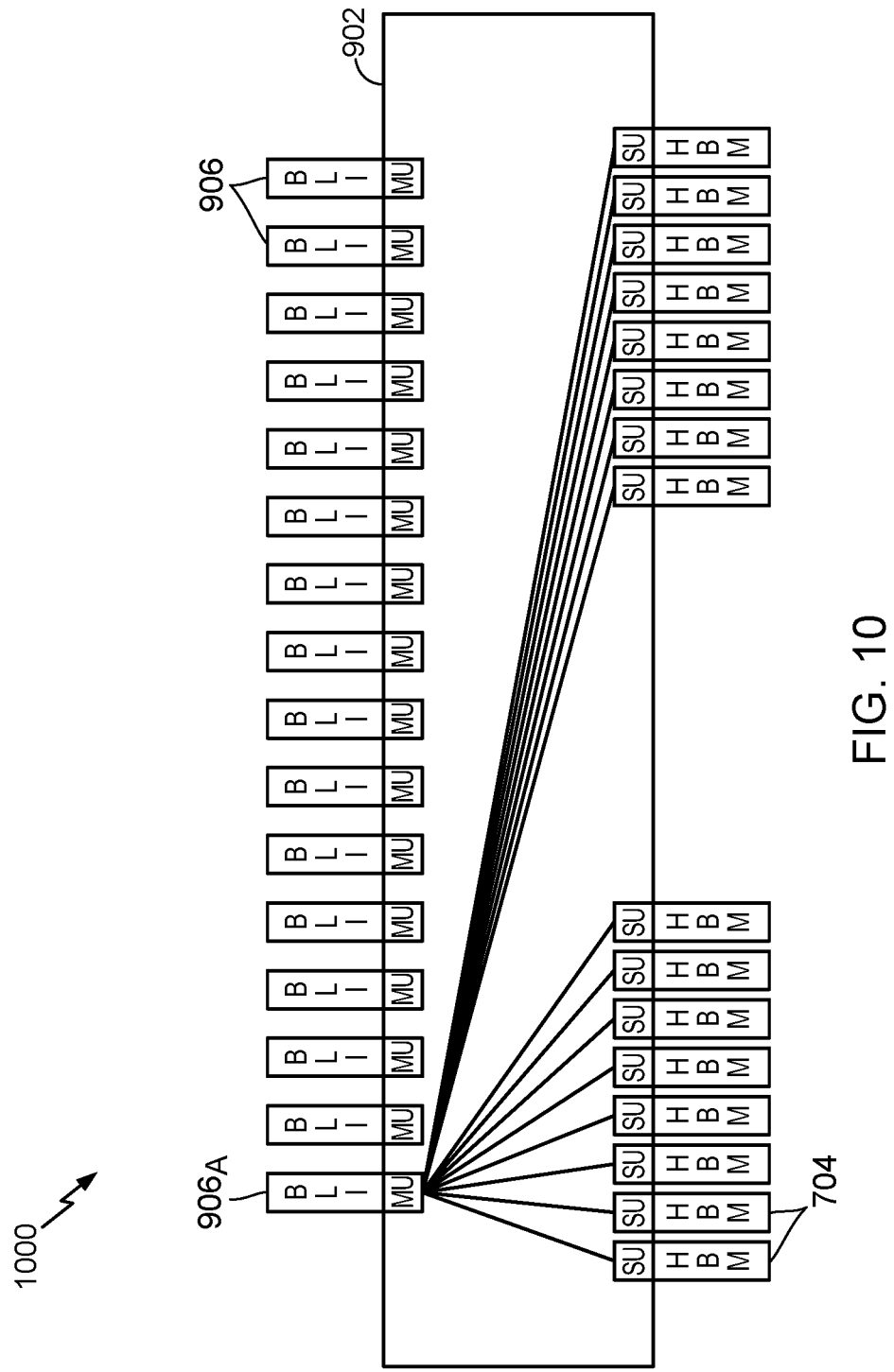
FIG. 10 is a block diagram of an example HBM buffer region in which one programmable IC interconnect channel has access to all the HBM channels, in accordance with an example of the present disclosure.

FIG. 10 portrays an example HBM buffer region 1000 in which the switch network 902 is configured such that one programmable IC interconnect channel $906_A$ has access to all the HBM channels 704, in accordance with an example of the present disclosure. In this manner, this particular channel $906_A$ has full addressability. However, the bandwidth may be limited by the BLI port and not by the HBM PC in this case. It is to be understood that the particular programmable IC interconnect channel can be any one of the interconnect channels 906 in other examples.

Figure 11:
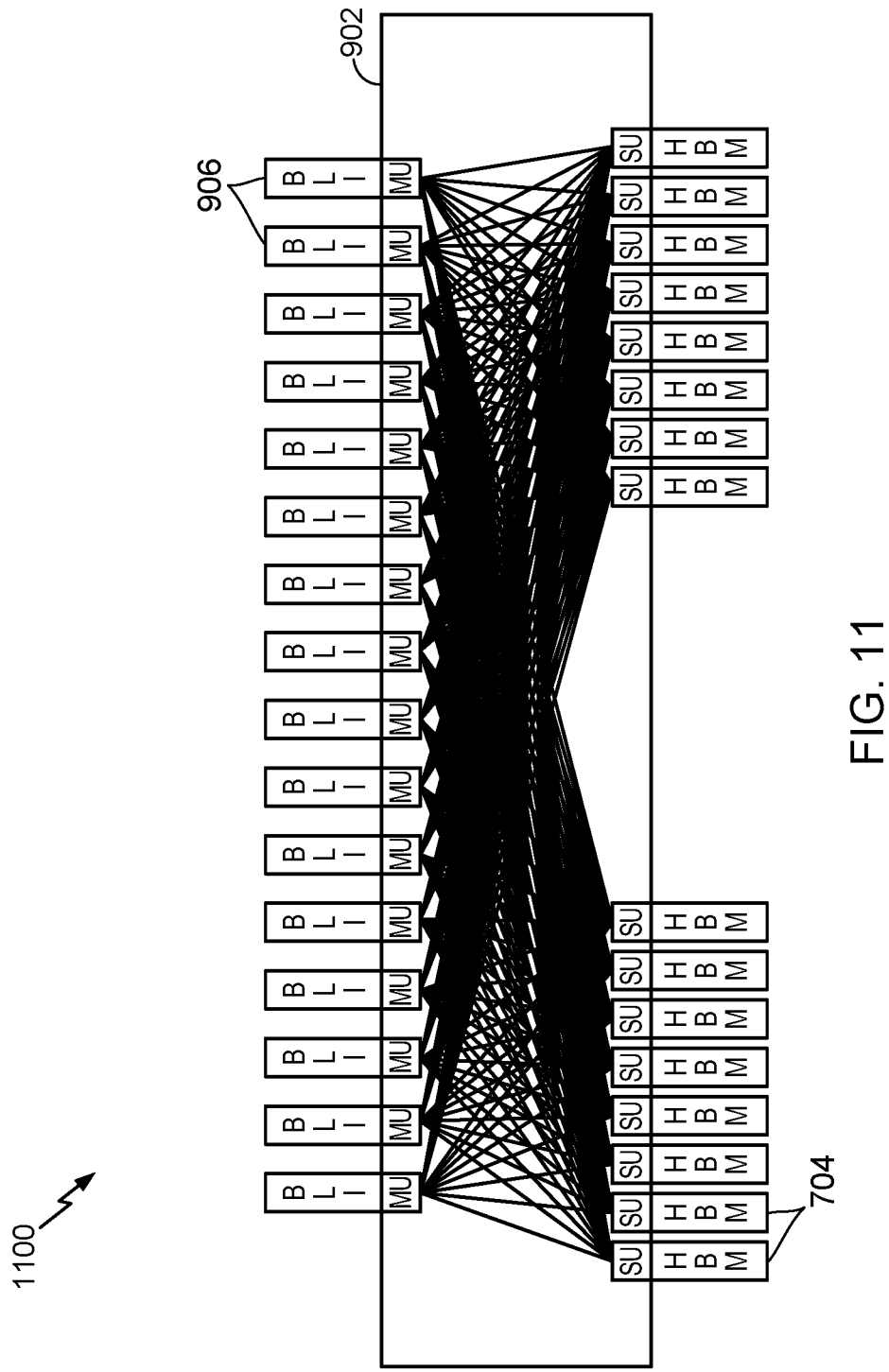
FIG. 11 is a block diagram of an example HBM buffer region in which each and every programmable IC interconnect channel has access to all the HBM channels, in accordance with an example of the present disclosure.

FIG. 11 depicts an example HBM buffer region 1100 in which the switch network 902 is configured such that each and every programmable IC interconnect channel 906 has access to all the HBM channels 704, in accordance with an example of the present disclosure. Referred to as a "full crossbar switch," this type of switch can implement both cases illustrated in FIGS. 9 and 10 and all combinations in between. Although a full crossbar switch is extremely flexible, it has two drawbacks. First, the full crossbar switch would have a very large implementation to realize the various combination of access paths, even if implemented as a hard block. Second, the latency of all paths including the affinity case would be relatively high (i.e., slow paths), such that the full crossbar switch would have considerable latency.

Figure 12:
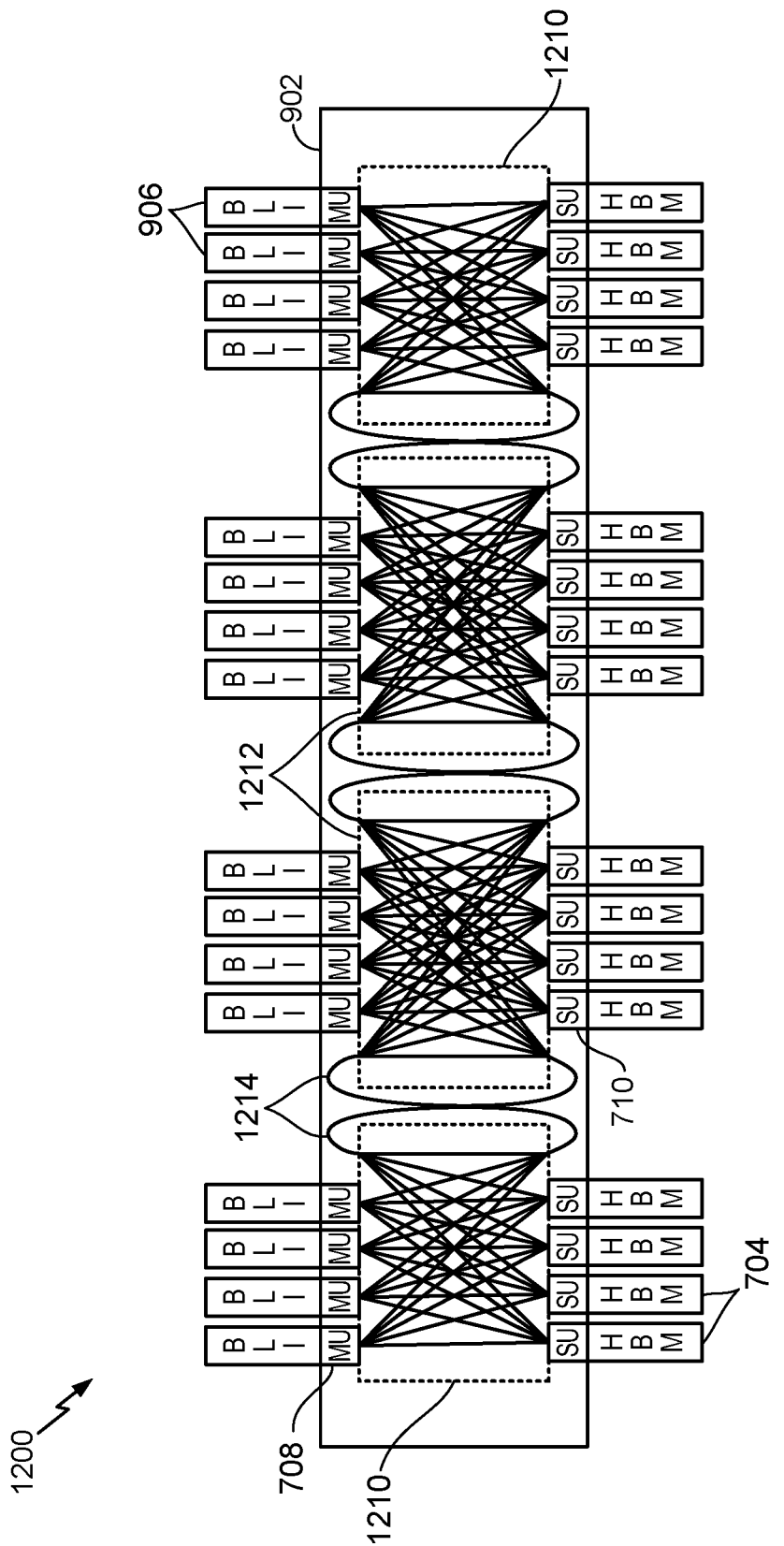
FIG. 12 is a block diagram of an example HBM buffer region with a hierarchical implementation of a switch network between the programmable IC interconnect channels and the HBM channels, in accordance with an example of the present disclosure.

One alternative to the full crossbar switch is a hierarchical switch. FIG. 12 illustrates an example HBM buffer region 1200 in which the switch network 902 is configured to implement a hierarchical switch between the programmable IC interconnect channels 906 and the HBM channels 704, in accordance with an example of the present disclosure. In this example implementation, the hierarchical switch comprises two 5:5 full crossbar switches 1210 and two 6:6 full crossbar switches 1212, with cross-coupled connections 1214 between adjacent full crossbar switches. The arrangement still offers the affinity case of FIG. 9 and the full addressability case of FIG. 11. Although two 5:5 full crossbar switches 1210 and two 6:6 full crossbar switches 1212 are illustrated in FIG. 12, it is to be understood that any of various suitable full crossbar configurations may be used to implement a hierarchical switch in the alternative (e.g., two 9:9 full crossbar switches, or two 3:3 full crossbar switches and six 4:4 full crossbar switches). The full addressability case latency for the hierarchical switch is a function of the number of switches cascaded between the programmable IC interconnect channels 906 and the HBM channels 704. The affinity case with the hierarchical switch has significantly less latency since a 6:6 full crossbar switch has significantly less latency than a 16:16 full crossbar switch (illustrated in FIG. 11).

In the flexible implementation of FIG. 11, the full crossbar switch provides a "dedicated" path between every master unit 708 and slave unit 710. Therefore, there is no blocking. In contrast, the hierarchical switch of FIG. 12 has some blocking. One example of blocking is a case where two of the master units 708 in the leftmost 5:5 full crossbar switch 1210 want to access two slave units 710 in the leftmost 6:6 full crossbar switch 1212. In this case, both paths through the switch network 702 would share one of the cross-coupled connections 1214 between the leftmost 5:5 and 6:6 full crossbar switches 1210, 1212. Since two master units 708 cannot concurrently use the same resource, one of the paths is said to "block" the other path's access to a slave unit 710 in the leftmost 6:6 full crossbar switch 1212.

To avoid blocking, a number of strategies may be employed. One strategy entails having a good scheduler that sequences the master units 708, such that one master unit does not block another. Another strategy involves using buffers at congestion points (e.g., at the cross-coupled connections 1214). With buffers, a subsequent data set received by a switch can be buffered until the switch resource is free (e.g., a previous data set received by the switch has been cleared out).

Based on the examples presented above, examples of the present disclosure offer countless switch implementations with good affinity latency and full addressability from any channel with minimal blocking and latency characteristics. Furthermore, some example switch implementations may provide an affinity bypass mode. The affinity bypass mode may offer an affinity case with the lowest possible latency, independent of the switch architecture.

Revisiting FIG. 8, instead of disposing the wafer section above an interposer at block 808 as described above, the operations 800 may alternatively involve disposing the wafer section above an interposer, wherein a first set of interconnection lines is routed through the interposer for electrically coupling a first plurality of ports of the interface region and the fixed feature die and wherein a second set of interconnection lines electrically couples a second plurality of ports of the interface region to the programmable IC region of the paired programmable IC and interface regions in the wafer section.

According to some examples, at least a portion of the second set of interconnection lines is routed through the interposer.

According to some examples, the programmable IC region and the interface region are part of a monolithic die. In this case, the second set of interconnection lines may be routed through at least one metallization layer of the monolithic die. For some examples, none of the second set of interconnection lines is routed through the interposer.

According to some examples, the operations 800 may further entail disposing the at least one fixed feature die above the interposer. In this case, the operations 800 may further involve disposing the interposer above a package substrate and encapsulating the at least one fixed feature die, the wafer section, the interposer, and at least a portion of the package substrate to form the integrated circuit package.

According to some examples, the interface region is capable of configuration as a switch network between the first plurality of ports and the second plurality of ports. For some examples the switch network provides full addressability between each of the first plurality of ports and each of the second plurality of ports such that each of the second plurality of ports has access to any one of the first plurality of ports. For some examples, the switch network provides a bypass mode in which each of the second plurality of ports has access to a different one of the first plurality of ports. For some examples, the switch network is implemented as a hierarchical switch network, which may be composed of a plurality of connected full crossbar switch networks. For some examples, the switch network is implemented as an AXI type switch network. For other examples, the switch network is implemented as a packet-protocol type switch network.

According to some examples, the operations 800 further include forming a scribe line between the programmable IC region and the interface region in each of the paired programmable IC and interface regions.

According to some examples, the fixed feature die is an HBM die. In this case, the interface region may be an HBM buffer region, and the first plurality of ports may include HBM channels (e.g., HBM PCs). The second plurality of ports may include programmable IC interconnect channels.

Example Hierarchical Switch Implementation

As described above, each of the HBM devices (e.g., in the case of the second generation of HBM devices, referred to as "HBM2" or "HBM Gen2") may support a 1024-bit data bus, split into 16 independent channels. Each of these HBM pseudo channels may access only $\frac{1}{16}^{th}$ of the HBM device address space. Therefore, the HBM buffer region may include a switch network that allows a single "kernel" (e.g., an interconnect channel in user soft logic of the programmable IC) to be able to access any portion of an HBM device (e.g., using a 1×16 crossbar switch as illustrated in FIG. 10). If the programmable IC supports n HBM devices, then this switch network may be expanded to a 1×16n crossbar switch (e.g., a 1×32 crossbar switch for supporting two HBM devices). For HBM Gen2 (running at 2 Gbps), each HBM pseudo channel is a 256-bit data bus (e.g., running at $\frac{1}{4}^{th}$ the frequency of the HBM data rate).

Assuming 32 kernels may access two HBM devices, then a full crossbar switch implementation (e.g., as illustrated in FIG. 11) may entail a 32×32 full crossbar switch with a 256-bit data bus. Such a full crossbar switch may be very expensive to implement in terms of area and power. Several programmable-IC/HBM use cases may implicate unified access to the HBM address space, but not all use cases specify full bandwidth with unified addressing. Furthermore, having all of the HBM switch interconnections in soft logic of the programmable IC may also be very expensive and may create a performance bottleneck.

As described above, one alternative to the full crossbar switch is a hierarchical switch (e.g., as illustrated in FIG. 12). Examples of the present disclosure provide various suitable implementations for such a hierarchical switch.

Each HBM memory stack may be divided into eight 128-bit-wide independent memory partitions. Each of these independent memory partitions may have independent clocks and timing, independent commands, and independent memory arrays. In other words, what happens in one memory partition may not affect another memory partition. Each of these eight partitions may be further subdivided into two 64-bit-wide independent partitions, which may be connected with the host (e.g., the fabric of the programmable IC) through an interface (e.g., an AXI interface), such as a switch network as described herein. Each of these subdivisions is referred to as an HBM pseudo channel (e.g., HBM channel 704).

Figure 13:
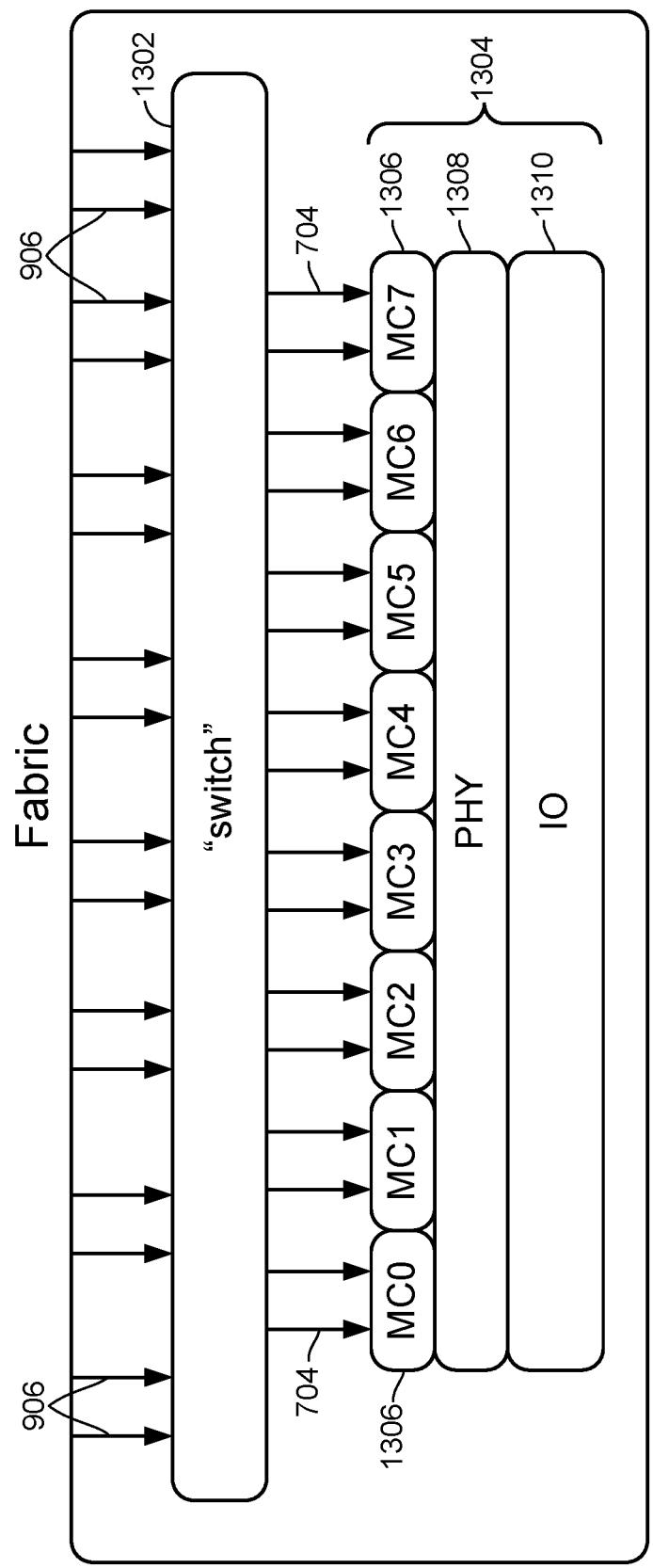
FIG. 13 is a block diagram of an example HBM buffer region coupled to an HBM die, the HBM buffer region having a switch network between the programmable IC interconnect channels and the HBM channels, which are coupled to HBM memory controllers in the HBM die, in accordance with an example of the present disclosure.

FIG. 13 is a block diagram of an example HBM buffer region 1302 coupled to an example HBM die 1304, in accordance with an example of the present disclosure. The HBM buffer region 1302 may be implemented with a switch network between the 16 programmable IC interconnect channels 906 (e.g., from the fabric of a programmable IC) and the 16 HBM channels 704. The HBM die 1304 includes a plurality of memory controllers 1306 (eight are shown, labeled as MC0 through MC7), a physical layer (PHY) 1308 coupled to the memory controllers 1306, and an input/output layer (I/O) 1310 coupled to the PHY 1308.

With the above description, each memory stack may include 16 AXI slaves. A 16-master-by-16-slave crossbar of AXI ports (e.g., as illustrated in the full crossbar switch of FIG. 11 or the hierarchical switch of FIG. 12) would provide full per-pseudo-channel control with full memory space access from each master port (e.g., each master unit 708). In the case of multiple HBM memory stacks, this crossbar switch may be extended. For example, with two HBM memory stacks, the crossbar switch may be extended to 32×32 AXI ports, as illustrated in FIG. 14.

Figure 14:
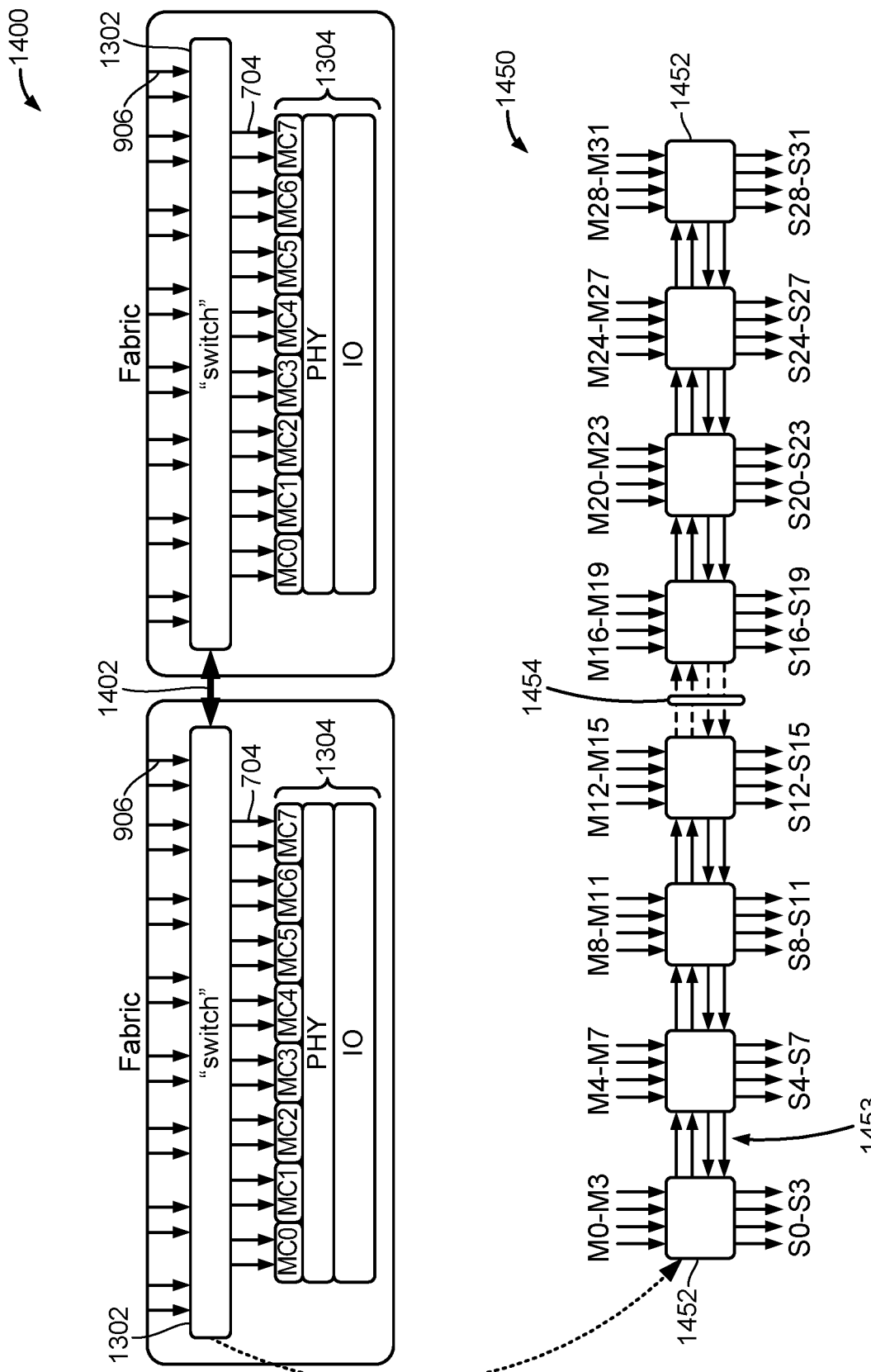
FIG. 14 is a block diagram of the example HBM buffer region of FIG. 13 coupled to two HBM dies, illustrating an example hierarchical implementation of the switch network, in accordance with an example of the present disclosure.

FIG. 14 provides a block diagram 1400 of the example HBM buffer region 1302 and switch network of FIG. 13 duplicated and coupled to two HBM dies 1304, in accordance with an example of the present disclosure. The switch networks may be coupled together via a pipeline 1402 for interconnections therebetween. In this case, there may be 32 programmable IC interconnect channels 906, each capable of accessing any of the 32 HBM channels 704.

The block diagram 1450 in FIG. 14 illustrates an example hierarchical implementation of the duplicated switch network. Each switch network is implemented with four full crossbar switches 1452. Each full crossbar switch 1452 may be coupled to four master ports (e.g., MUs 708) (which may be coupled to corresponding programmable IC interconnect channels 906) and to four corresponding slave ports (e.g., SUs 710) (which may be coupled to corresponding HBM channels 704). With 32 programmable IC interconnect channels 906 and 32 HBM channels, eight full crossbar switches 1452 may be coupled to 32 master ports (labeled M0-M31) and 32 slave ports (labeled S0-S31), as depicted.

Each pair of adjacent full crossbar switches 1452 may be connected via cross-coupled connections 1453. For example, the cross-coupled connections 1453 between adjacent full crossbar switches 1452 may include four connections: two connections from left-to-right and two connections from right-to-left. Each of these may be considered as an outbound connection or an inbound connection, depending on the perspective of each full crossbar switch 1452. The two switch networks may be interconnected via a pipeline 1454, which may be implemented with connections similar to the cross-coupled connections 1453. The full crossbar switches 1452 on the ends in the block diagram 1450 are not coupled to other full crossbar switches. Thus, the full crossbar switches 1452 on the ends may have no cross-coupled connections 1453 coupled thereto on a side associated with no adjacent full crossbar switch, for some examples. In other words, the full crossbar switches 1452 on the ends may be cross-couple to one adjacent full crossbar switch, whereas the full crossbar switches in the middle of the switch network may be cross-coupled to two adjacent full crossbar switches, as illustrated in FIG. 14. In other examples, the full crossbar switches 1452 on the ends may have the cross-coupled connections 1453 on the side associated with no adjacent full crossbar switch, but these cross-coupled connections are not coupled to anything else.

FIGS. 15A-15H illustrate the different access capabilities of each master port (e.g., MU 708) and master cross-coupled connection port in an example full crossbar switch 1452 in the implementation of FIG. 14, in accordance with an example of the present disclosure. FIG. 16 is an example table 1600 defining the different access capabilities of each master port and master cross-coupled connection port, as illustrated in FIGS. 15A-15H, in accordance with an example of the present disclosure. In the table 1600, a "1" at an intersection of a row and a column indicates that the master port or master cross-coupled connection port in that row can access the slave port or slave cross-coupled connection port in that column corresponding to the intersection. A "0" at an intersection indicates no access capability. For some examples, these access capabilities may be enforced according to assigned hardware connections (e.g., in each full crossbar switch 1452); in other words, there may be no hardware connection available between certain ports lacking access capability.

Each of FIGS. 15A-15H illustrates four master ports (labeled M0-M3) and four slave ports (labeled S0-S3), although any of FIGS. 15A-15H may represent any one of the full crossbar switches 1452 in the block diagram 1450 of FIG. 14. The cross-coupled connections 1453 on the left side of the full crossbar switch 1452 include two inbound ports (e.g., left master cross-coupled connection ports, labeled LM_0 and LM_1) and two outbound ports (e.g., left slave cross-coupled connection ports, labeled LS_0 and LS_1), from the perspective of this particular switch. The cross-coupled connections 1453 on the right side of the full crossbar switch 1452 include two inbound ports (e.g., right master cross-coupled connection ports, labeled RM_0 and RM_1) and two outbound ports (e.g., right slave cross-coupled ports, labeled RS_0 and RS_1).

Figure 15A:
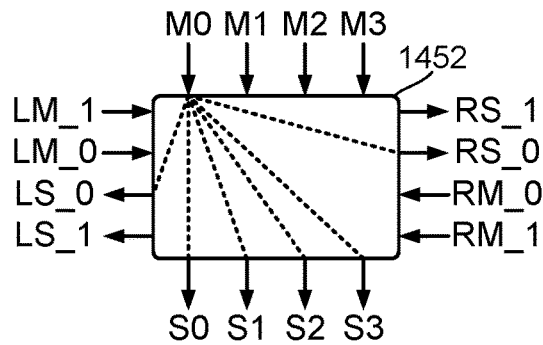
FIGS. 15A-15H illustrate the different access capabilities of each master unit (MU) in an example full crossbar switch in the implementation of FIG. 14, in accordance with an example of the present disclosure.
Figure 15B:
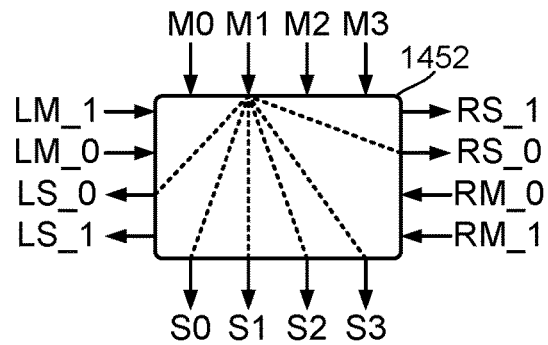
Figure 15C:
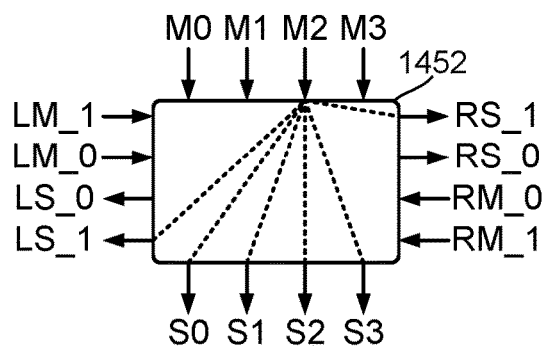
Figure 15D:
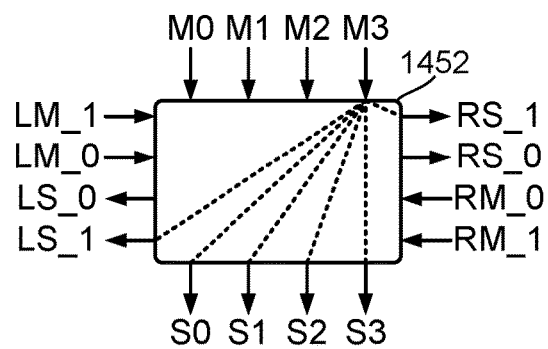

Each of the master ports (e.g., the top inputs) may be capable of accessing six ports each (e.g., four bottom outputs, one left output, and one right output). For example, master port 0 (M0) in FIG. 15A is capable of accessing any of the slave ports (S0-S3), LS_0, or RS_0. The master port 1 (M1) routing in FIG. 15B is similar to FIG. 15A, in agreement with the table 1600 in FIG. 16. As another example, master port 2 (M2) in FIG. 15C is capable of accessing any of S0-S3, LS_1, or RS_1. The master port 3 (M3) routing in FIG. 15D is similar to FIG. 15C.

Figure 15E:
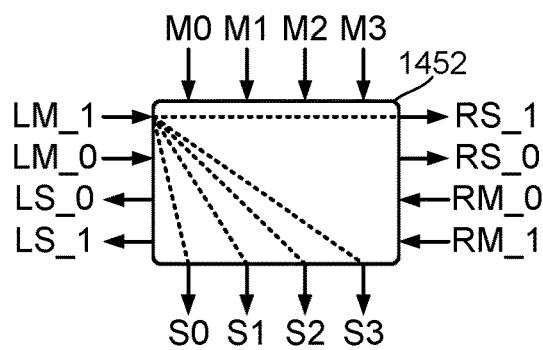
Figure 15F:
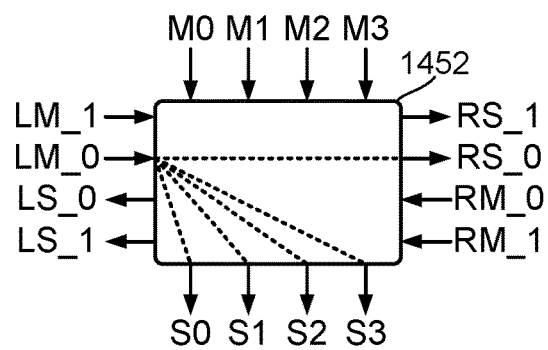
Figure 15G:
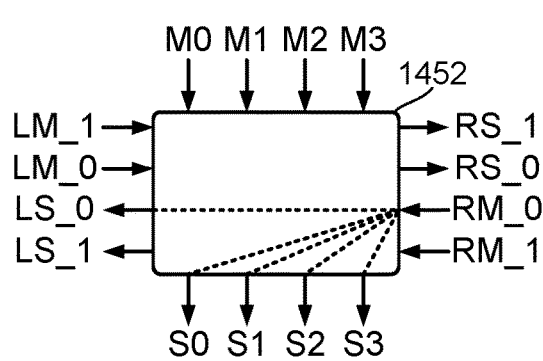
Figure 15H:
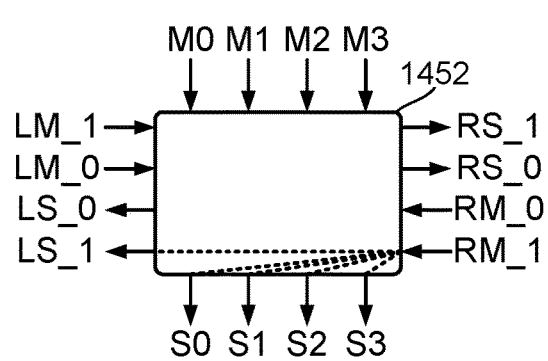

Each of the master cross-coupled connection ports (e.g., the side inputs) may be capable of accessing five ports each (e.g., four bottom outputs and one side output on the opposite side of the full crossbar switch 1452). The side output on the opposite of the full crossbar switch 1452 may be a slave cross-coupled port corresponding to the master cross-coupled connection port. For example, LM_1 in FIG. 15E is capable of accessing any of S0-S3 or RS_1, LM_0 in FIG. 15F is capable of accessing any of S0-S3 or RS_0, RM_0 in FIG. 15G is capable of accessing any of S0-S3 or LS_0, and RM_1 in FIG. 15H is capable of accessing any of S0-S3 or LS_1.

Each switch network being implemented as four 4×4 full crossbar switches 1452 in FIG. 14 is provided only as an example. A different number (e.g., other than four) of full crossbar switches may be used to implement a switch network. Furthermore, one, multiple, or all of the full crossbar switches may have a different number of master ports and/or slave ports associated therewith (e.g., other than four). For example, a 16×16 switch network may alternatively be implemented with two 3×3 full crossbar switches and two 5×5 full crossbar switches. Furthermore, the different access capabilities illustrated in FIGS. 15A-15H and table 1600 in FIG. 16 are also provided only as an example. Each of the various master ports and master cross-coupled connection ports illustrated may have different access capabilities, especially if a full crossbar switch is implemented with a different number of master ports, a different number of master cross-coupled connection ports, a different number of slave ports, and/or a different number of slave cross-coupled connection ports.

As described above, the switch network may be implemented as an AXI type switch network or as a packet-protocol type switch network. The programmable IC soft logic (e.g., the kernel master) may have address and data bits for each instance (e.g., each packet), which is routed to the proper programmable IC interconnect channel and associated master port based on the address. Based on this same address, the switch network may route the instance to the proper slave port (and associated HBM channel), using AXI or packet protocols.

For the implementation of the hierarchical switch network illustrated in the block diagram 1450 of FIG. 14, the master address and AXI ID may be modified to provide uniform contiguous addressing across all possible masters from the programmable IC fabric. AXI switch address decoding may be extended by N bits, where N=$\log_2$(number of slaves). Thus, in the case of 32 slaves over two HBM stacks, N=5 extended address bits may be used to select the slave target. To simply the hardened switch, a fixed byte address of 32 bits may be allocated per HBM pseudo channel, and the switch full address space is thus N+32 bits.

The actual per-channel and total address space in a given HBM memory stack may entail less than or equal to the 32 bits of addressing provided in the switch. In a switch utilizing only P address bits, where P<32, 32–P "0" bits may be inserted by the host to extend the slave address to the full 32 bits. For example, an HBM configuration employing only 29 bits of addressing per slave may create a host address {N bits, 29 bits}. This address may then be extended to {N bits, b000, 29 bits} before connecting to the switch.

Within a hardened switch, the address may further be mapped to provide uniform addressing. For example, the master port number M may be subtracted from the slave select address S to form a signed remapped slave select. This remapped value S'=S–M is an N+1 bit signed number. Negative S' addresses slave numbers less than current master number, whereas positive S' addresses higher slave numbers than the current master number. For example, an S' of –4 addresses a slave port 4 positions lower than the current master connection.

In addition to master address expansion to cover N slaves, the master AXI IDs may also be extended by N bits to map return data and responses from slave back to master. This extension may be accomplished by extended ID at the input of each master (e.g., {N, AXI ID}). This AXI ID extension, along with a fixed routing for any master to slave path, may render any additional switch AXI ID tags to properly route AXI commands unnecessary.

Figure 14A:
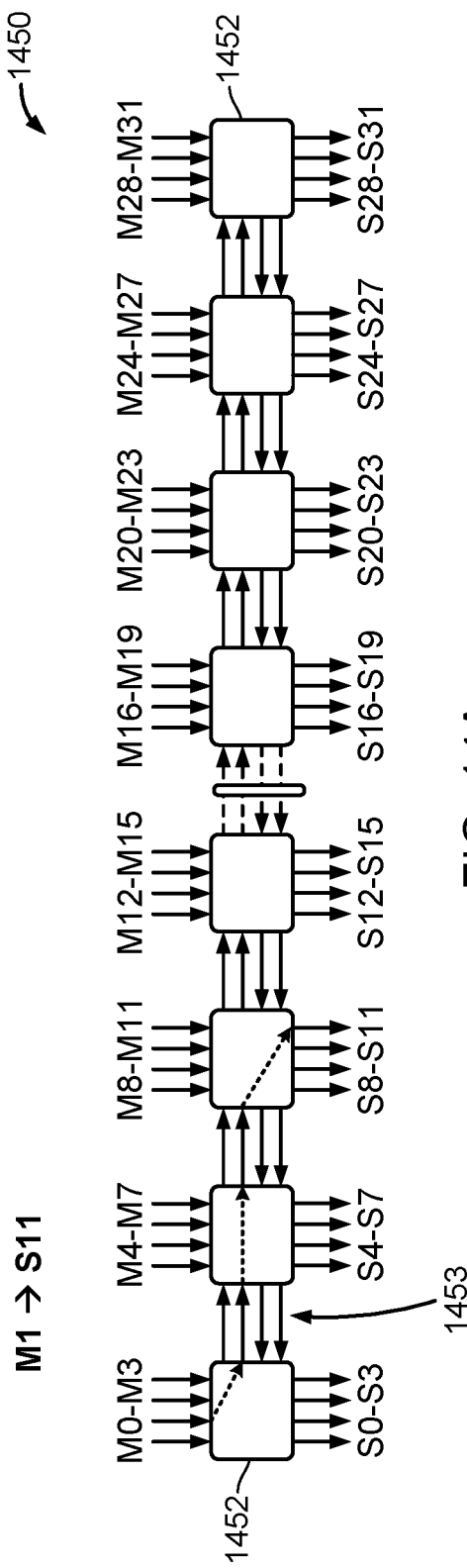
FIGS. 14A and 14B illustrate examples of accessing slave units from master units in different full crossbar switches in the hierarchical implementation of FIG. 14, in accordance with examples of the present disclosure.

Returning to the 32×32 hierarchical crossbar switch implementation in FIG. 14, any master port can access any slave port, and hence, any HBM pseudo channel. For example, FIG. 14A illustrates master port 1 (M1) accessing slave port 11 (S11) in a different full crossbar switch 1452. In this example, the routing from M1 matches the routing in FIG. 15B, and since S11 is in a different full crossbar switch 1452 to the right, M1 is routed to output port RS_0. At the full crossbar switch 1452 with master ports 4-7 (M4-M7), the input port LM_0 (connected via a cross-coupled connection 1453 to the output port RS_0 of the full crossbar switch with M1) is routed to the output port RS_0 according to the routing in FIG. 15F. At the full crossbar switch 1452 with master ports 8-11 (M8-M11), the input port LM_0 (connected to the output port RS_0 of the full crossbar switch with M4-M7) is routed to S11 according to the routing in FIG. 15F (in which S3 would correspond to S11).

Figure 14B:
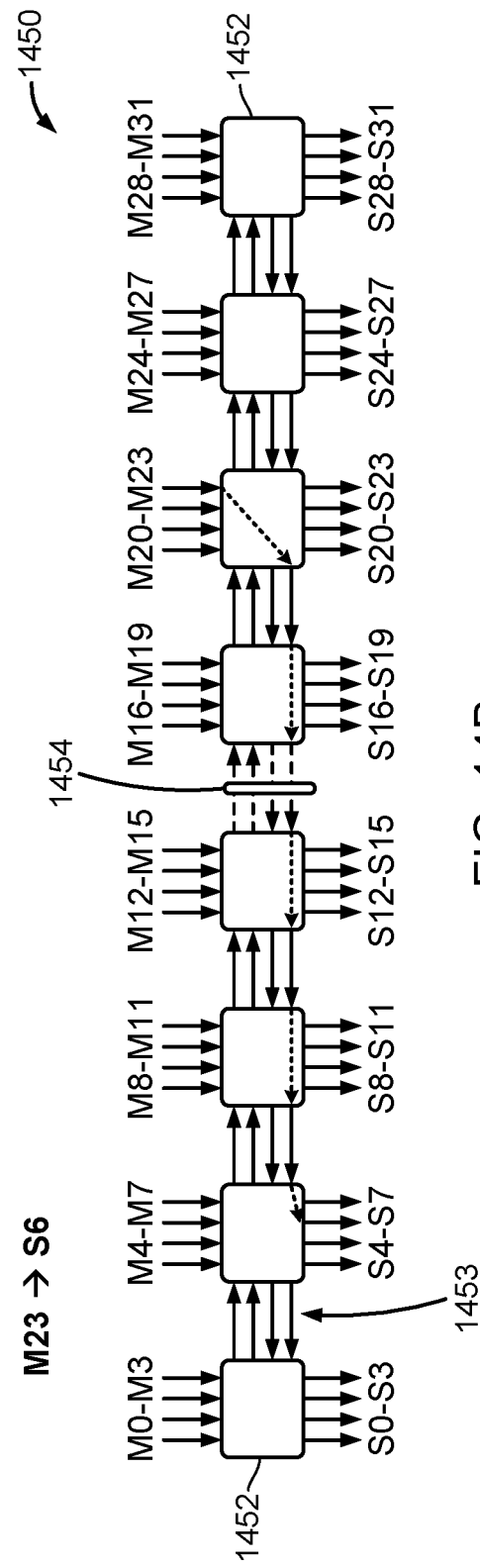

As another example, FIG. 14B illustrates master port 23 (M23) accessing slave port 6 (S6) in a different full crossbar switch 1452 and associated with a different HBM die 1304, via the pipeline 1454. In this example, M23 would correspond to M3, and thus, the routing from M23 matches the routing in FIG. 15D. Because S6 is in a different full crossbar switch 1452 to the left, M23 is routed to output port LS_1 according to the routing in FIG. 15D. At the full crossbar switch 1452 with master ports 16-19 (M16-M19), the input port RM_1 (connected via a cross-coupled connection 1453 to the output port LS_1 of the full crossbar switch with M23) is routed to the output port LS_1 according to the routing in FIG. 15H. Similarly, at the full crossbar switches 1452 with master ports 12-15 (M12-M15) and 8-11 (M8-11), the input ports RM_1 (connected to the output ports LS_1 of the full crossbar switches with M16-19 and M12-15, respectively) are routed to the output ports LS_1 according to the routing in FIG. 15H. At the full crossbar switch 1452 with M4-M7, the input port RM_1 (connected to the output port LS_1 of the full crossbar switch with M8-M11) is routed to S6 according to the routing in FIG. 15H (in which S2 would correspond to S6).

Although any master port can access any slave port as described above, the cross-sectional bandwidth may be limited by the number of channels devoted to this implementation. With a programmable IC such as an FPGA, more bandwidth may be desired from the perspective of a master unit accessing HBM. According to some examples, a technique referred to as "channel ganging" may be used to increase throughput.

Figure 17:
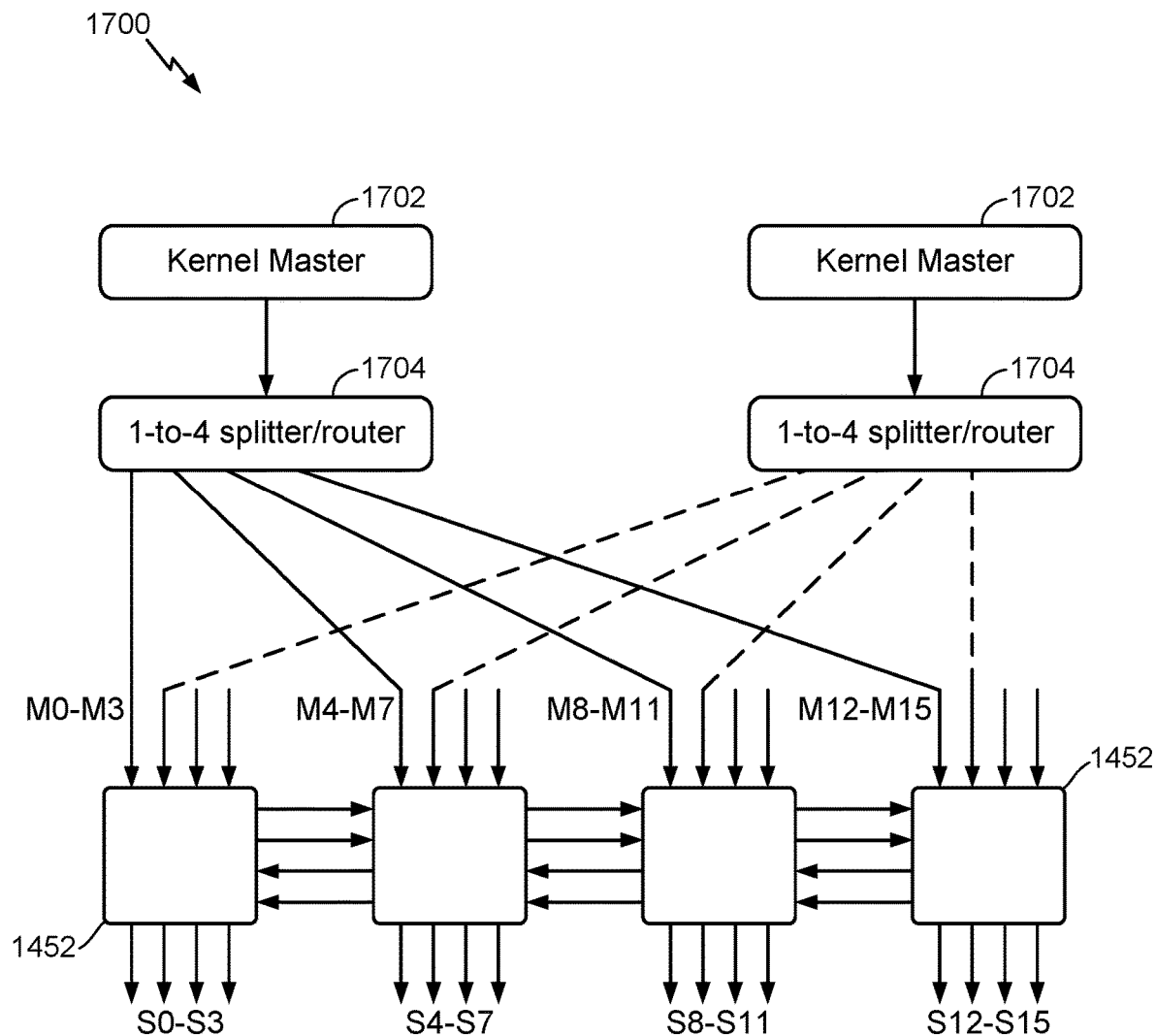
FIG. 17 is a block diagram illustrating multiple splitters interfaced with an example HBM buffer region with a hierarchical implementation of a switch network between the programmable IC interconnect channels and the HBM channels, in accordance with an example of the present disclosure.

FIG. 17 is a block diagram 1700 illustrating the concept of channel ganging for one of the two switch networks of FIG. 14, in accordance with an example of the present disclosure. In this example, the programmable IC may include multiple kernel masters 1702, which is a master in the programmable IC wanting to access HBM pseudo channels. Each kernel master 1702 may be coupled to a splitter/router 1704, and both the kernel master and the splitter/router may be implemented in soft logic. In the example of FIG. 17, 16 HBM pseudo channels (coupled to slave ports S0-S15) are grouped such that four pseudo channels (e.g., the channels associated with S0-S3) are ganged together and treated as one quad-width channel. Therefore, a kernel master 1702 with channel ganging effectively sees $\frac{1}{4}^{th}$ the number of HBM channels, as compared to a kernel master without channel ganging. Accordingly, instead of a 16×16 hierarchical switch network implemented with four of the full crossbar switches 1452, channel ganging provides a dual 4×4 switch network with full access and increased bandwidth. One 4×4 switch network may be used for least significant bits (LSBs), and so forth.

With channel ganging and the splitter/routers 1704, a request will be routed from the splitter/router to a particular quadrant (e.g., one of the four full crossbar switches 1452), but will not be routed to the left or right of this quadrant. Each quadrant is connected 4×4 from the top, as described above. By utilizing the splitter/router 1704 in this matter, left and/or right bandwidth is needless, but the equivalent access of a 16×16 switch network is still achieved. Each of the splitter/routers 1704 may be configured to access a designated master port in each of the full crossbar switches 1452. For example, one splitter/router 1704 may be configured to access M0, M4, M8, and M12 (the leftmost of the top inputs in each full crossbar switch 1452) as depicted in FIG. 17. Another splitter/router 1704 may be configured to access M1, M5, M9, and M13 as shown.

Within the fabric-based soft logic of the programmable IC, any number of AXI masters may be coupled to each AXI switch master port through, for example, an AXI bridge arbitration. This flexibility may be facilitated by supporting multiple AXI IDs per switch port and providing synchronization between each master port and internal global switch clock. The support for multiple AXI IDs may provide for easier concentration of multiple independent processing kernels.

Some examples of the present disclosure provide a switch network based on a partially populated 8×8 crossbar (or 256-bit data busses) with (i) unified access for any user kernel to all of the HBM address space, (ii) full bandwidth within grouped channels (e.g., ganged quad channels), and (iii) switch-interconnect expansion into the programmable IC fabric to augment a unified-addressable HBM throughout.

Example Operations for Routing Signals

Figure 18:
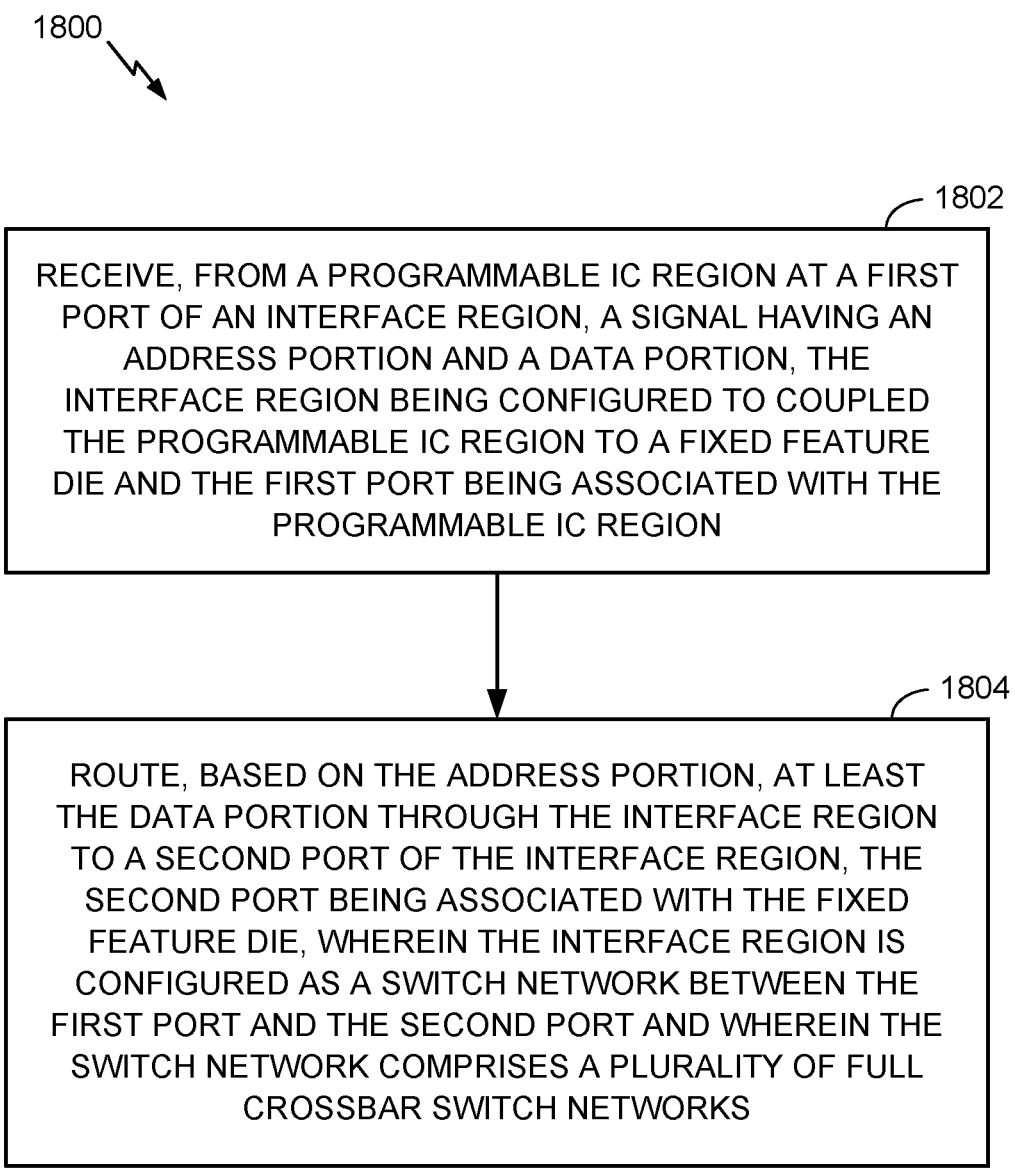
FIG. 18 is a flow diagram of example operations for routing signals, in accordance with an example of the present disclosure.

FIG. 18 is a flow diagram of example operations 1800 for routing signals between an apparatus and a fixed feature die, in accordance with an example of the present disclosure. The operations 1800 may be performed, for example, by the apparatus, which includes a programmable IC region and an interface region configured to couple the programmable IC region to the fixed feature die, as described above.

The operations 1800 may begin, at block 1802, with a first port of the interface region receiving, from the programmable IC region, a signal having an address portion and a data portion. The first port may be associated with the programmable IC region. At block 1804, at least the data portion of the signal may be routed, based on the address portion, through the interface region to a second port of the interface region. The second port may be associated with the fixed feature die. The interface region may be configured as a switch network between the first port and the second port, and the switch network may comprise a plurality of full crossbar switch networks.

According to some examples, the programmable IC region comprises an FPGA region, and the fixed feature die comprises an HBM) die. In this case, the interface region may include an HBM buffer region, and the second port may be associated with an HBM channel.

According to some examples, the routing at block 1804 involves using at least one of an AXI protocol or a packet protocol.

According to some examples, the operations 1800 further entail routing the signal through a splitter implemented in the programmable IC region. The splitter may be configured to access the first port of the interface region.

As used herein (including the claims that follow), a phrase referring to "at least one of" a list of items refers to any combination of those items, including single members. As an example, "at least one of: x, y, or z" is intended to cover: x, y, z, x-y, x-z, y-z, x-y-z, and any combination thereof (e.g., x-y-y and x-x-y-z).

While the foregoing is directed to examples of the present disclosure, other and further examples of the disclosure may be devised without departing from the basic scope thereof, and the scope thereof is determined by the claims that follow.

What is claimed is:
1. An apparatus comprising:
a programmable integrated circuit (IC) region; and
an interface region configured to couple the programmable IC region to at least one fixed feature die, wherein:
the interface region is configured as a switch network having a first plurality of ports and a second plurality of ports, the first plurality of ports being configured to be electrically connected to the at least one fixed feature die, and the second plurality of ports being electrically connected to the programmable IC region;

the switch network comprises a plurality of full crossbar switch networks, each of the full crossbar switch networks comprising crossbar switches, each of the crossbar switches being electrically connected to at least one port of the first plurality of ports and to at least one port of the second plurality of ports, each of the crossbar switches being cross-coupled via one or more buffers to another of the crossbar switches; and each adjacent pair of the plurality of full crossbar switch networks is connected together via a plurality of cross-coupled connections.

2. The apparatus of claim 1, wherein:
each of the full crossbar switch networks comprises a subset of the first plurality of ports and a subset of the second plurality of ports; and
each port in the subset of the second plurality of ports is capable of accessing any port in the subset of the first plurality of ports.

3. The apparatus of claim 2, wherein the subset of the first plurality of ports comprises four ports and wherein the subset of the second plurality of ports comprises four ports.

4. The apparatus of claim 2, wherein the plurality of cross-coupled connections comprises at least two outbound connections and at least two inbound connections.

5. The apparatus of claim 4, each of the at least two inbound connections is capable of accessing any port in the subset of the first plurality of ports and at least one of the outbound connections.

6. The apparatus of claim 2, wherein each port in the subset of the second plurality of ports is capable of accessing any port in the subset of the first plurality of ports and at least one of the plurality of cross-coupled connections.

7. The apparatus of claim 1, wherein:
the programmable IC region is configured to implement a plurality of splitters, each of the plurality of splitters being configured to access a designated port of the second plurality of ports in each of the crossbar switches.

8. The apparatus of claim 7, wherein the plurality of full crossbar switch networks comprises four full crossbar switch networks, wherein the second plurality of ports comprises sixteen ports, and wherein the plurality of splitters comprises two splitters, such that each of the two splitters is configured to access four designated ports in the second plurality of ports.

9. The apparatus of claim 1, wherein the switch network is configured as at least one of an Advanced eXtensible Interface (AXI) type switch network or a packet-protocol type switch network.

10. An integrated circuit (IC) package comprising the apparatus of claim 1 and further comprising:
a package substrate;
at least one interposer disposed above the package substrate; and
the at least one fixed feature die disposed above the interposer; wherein:
the apparatus is disposed above the interposer; and
the interface region is configured to couple the programmable IC region to the at least one fixed feature die via a first set of interconnection lines routed through the interposer between the first plurality of ports of the interface region and the at least one fixed feature die and a second set of interconnection lines routed between the second plurality of ports of the interface region and the programmable IC region.

11. The package of claim 10, wherein the programmable IC region and the interface region are part of a monolithic die and wherein the second set of interconnection lines is routed through at least one metallization layer of the monolithic die.

12. The package of claim 11, wherein none of the second set of interconnection lines is routed through the interposer.

13. The package of claim 10, wherein:
at least a portion of the second set of interconnection lines is routed through the interposer; and
the programmable IC region and the interface region share the same wafer-level substrate and are separated on the wafer-level substrate by a scribe line.

14. The package of claim 10, wherein the programmable IC region comprises a field programmable gate array (FPGA) region, wherein the at least one fixed feature die comprises at least one high bandwidth memory (HBM) die, wherein the interface region comprises an HBM buffer region, and wherein the first plurality of ports is associated with a plurality of HBM channels.

15. A method for routing signals between an apparatus and a fixed feature die, the apparatus comprising a programmable integrated circuit (IC) region and an interface region configured to couple the programmable IC region to the fixed feature die, the method comprising:
receiving, from the programmable IC region at a first port of the interface region, a signal having an address portion and a data portion, the first port being associated with the programmable IC region; and
based on the address portion, routing at least the data portion of the signal through the interface region to a second port of the interface region, the second port being associated with the fixed feature die, wherein:
the interface region is configured as a switch network between the first port and the second port; and
the switch network comprises a plurality of full crossbar switch networks, wherein at least one of the plurality of full crossbar switch networks comprises crossbar switches, at least one of the crossbar switches being coupled to the first port and to the second port, and being cross-coupled via one or more buffers to another of the crossbar switches.

16. The method of claim 15, wherein the programmable IC region comprises a field programmable gate array (FPGA) region, wherein the fixed feature die comprises a high bandwidth memory (HBM) die, wherein the interface region comprises an HBM buffer region, and wherein the second port is associated with an HBM channel.

17. The method of claim 15, further comprising routing the signal through a splitter implemented in the programmable IC region and configured to access the first port of the interface region.

18. An apparatus comprising:
a programmable integrated circuit (IC); and
an interface circuit configured to couple the programmable IC to a first high bandwidth memory (HBM) chip stack and a second HBM chip stack, the interface circuit comprising full crossbar switch networks, slave output ports, and master input ports, wherein:
each of the full crossbar switch networks comprises crossbar switches;
each of the crossbar switches has a unique subset of the slave output ports, a unique subset of the master input ports, one or more lateral output ports, and one or more lateral input ports;
for each of the crossbar switches, the respective crossbar switch in a respective full crossbar switch network has a port of the one or more lateral output ports and a port of the one or more lateral input ports connected to a port of the one or more lateral input ports and a port of the one or more lateral output ports, respectively, of another of the crossbar switches in the respective full crossbar switch network;

for each adjacent pair of the full crossbar switch networks, one of the adjacent pair has one of the crossbar switches that has a port of the one or more lateral output ports and a port of the one or more lateral input ports connected to a port of the one or more lateral input ports and a port of the one or more lateral output ports, respectively, of one of the crossbar switches of the other one of the adjacent pair;

the master input ports are electrically connected to the programmable IC; and each of the slave output ports is configured to be electrically connected to a respective one of the first HBM chip stack and the second HBM chip stack, each of the slave output ports being addressable by an extension of a target memory address of memory of the first HBM chip stack or the second HBM chip stack, the slave output ports being configured to be addressable to provide uniform addressing across the first HBM chip stack and the second HBM chip stack.

19. The apparatus of claim 18, wherein for each of the crossbar switches, the one or more lateral input ports of the respective crossbar switch are configured to access each of the slave output ports of the respective crossbar switch.

20. The apparatus of claim 18, wherein the extension includes bits pre-pended to the target memory address.

* * * * *